(12) United States Patent
Chellamuthu et al.

(10) Patent No.: US 10,884,037 B2
(45) Date of Patent: Jan. 5, 2021

(54) ANGULAR RESOLVER IMBALANCE DETECTION

(71) Applicant: Texas Instruments Incorporated, Dallas, TX (US)

(72) Inventors: Shanmuganand Chellamuthu, Richardson, TX (US); Qunying Li, Allen, TX (US); Sri Navaneethakrishnan Easwaran, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/263,114

(22) Filed: Sep. 12, 2016

(65) Prior Publication Data

US 2018/0073895 A1  Mar. 15, 2018

(51) Int. Cl.
G01D 5/14 (2006.01)
G01R 19/25 (2006.01)
(Continued)

(52) U.S. Cl.
CPC .......... G01R 19/2513 (2013.01); G01D 3/08 (2013.01); G01D 5/208 (2013.01); G01D 5/2073 (2013.01); *G01D 5/24461* (2013.01)

(58) Field of Classification Search
CPC .......... G01D 5/24466; G01D 5/24461; G01D 5/24457; G01D 5/2291
See application file for complete search history.

(56) References Cited

U.S. PATENT DOCUMENTS 3,028,504 A * 4/1962 Close .................. G06G 7/22
307/33
4,355,305 A   10/1982 Cording et al.
(Continued)

FOREIGN PATENT DOCUMENTS

JP    2006138778 A    6/2006
RU    2044274 C1     9/1995

OTHER PUBLICATIONS

PCT Search Report for Application No. PCT/US 2017/051184, dated Dec. 28, 2017.
European Search Report dated Oct. 10, 2019.

*Primary Examiner* — Walter L Lindsay, Jr.
*Assistant Examiner* — Milton Gonzalez
(74) *Attorney, Agent, or Firm* — Lawrence J. Bassuk; Charles A. Brill; Frank D. Cimino

(57) ABSTRACT

An angular resolver system includes, for example, an imbalance detector for detecting degraded resolver output signals. The imbalance detector includes a first and second power averaging circuits and a comparator circuit. The first power averaging circuit includes a first integrator for generating over a first time window a first average power signal in response to resolver sensor output signals. The second power averaging circuit includes a second integrator for generating over a second time window a second average power signal in response to the resolver sensor output signals, where the first time window is longer than the second time window. The comparator circuit compares the first average power signal and the second average power signal and generates a fault signal when the first average power signal and the second average power signal differ by a selected voltage threshold.

15 Claims, 17 Drawing Sheets

(51) Int. Cl.
  *G01D 5/20* (2006.01)
  *G01D 3/08* (2006.01)
  *G01D 5/244* (2006.01)

(56) References Cited

U.S. PATENT DOCUMENTS

| | | | | |
|---|---|---|---|---|
| 4,740,778 | A * | 4/1988 | Harding | G01D 3/10 |
| | | | | 172/3 |
| 5,064,274 | A * | 11/1991 | Alten | B60R 1/087 |
| | | | | 250/210 |
| 5,691,611 | A * | 11/1997 | Kojima | B60L 3/0023 |
| | | | | 318/400.04 |
| 6,205,009 | B1 | 3/2001 | Clark | |
| 7,138,794 | B1 * | 11/2006 | Cook | G01D 1/18 |
| | | | | 324/207.18 |
| 7,372,686 | B2 * | 5/2008 | Ochiai | B60L 3/0023 |
| | | | | 361/23 |
| 7,382,295 | B2 * | 6/2008 | Otsuka | B62D 5/046 |
| | | | | 250/231.13 |
| 7,513,169 | B2 * | 4/2009 | Noritou | G01D 3/08 |
| | | | | 73/862.326 |
| 7,603,250 | B2 * | 10/2009 | Nishimoto | G01D 5/24461 |
| | | | | 702/150 |
| 7,855,562 | B2 * | 12/2010 | Chiaburu | G01L 27/007 |
| | | | | 324/537 |
| 9,043,165 | B2 * | 5/2015 | Oowada | G01D 5/24461 |
| | | | | 702/35 |
| 9,182,251 | B2 | 11/2015 | Shinohara | |
| 9,228,910 | B2 * | 1/2016 | Sasaki | G01L 5/221 |
| 2013/0049741 | A1 | 2/2013 | Kichise | |
| 2015/0362341 | A1 | 12/2015 | Kirschner et al. | |

\* cited by examiner

ANGULAR RESOLVER IMBALANCE DETECTION

BACKGROUND

Computers (including processors) are increasingly used to control the movement of physical devices such as motors and robots. The computers control the movement of such physical devices in response to positioning (including speed) information received from sensors. The information from the sensors is often conveyed as one or more electrical signals. However, the sensors are often located in electrically noisy environments (such as a gasoline-engine compartment) where components such as switches and coils generate substantial amounts of electromagnetic interference, which typically degrades the quality and resolution of the conveyed electrical signals. The degraded electrical signals limit the speeds and/or accuracy of the controlled attributes (such as motor speeds, angular displacement, and the like) of the controlled physical devices, which normally limits the degree to which the computers can control a physical device.

SUMMARY

The problems noted above can be addressed in a sensing system and method for performing angular resolver imbalance detection. An angular resolver diagnostic system includes, for example, an imbalance detector for detecting degraded resolver output signals. The imbalance detector includes first and second power averaging circuits and a comparator circuit. The first power averaging circuit includes a first integrator for generating over a first time window a first average power signal in response to resolver sensor output signals. The second power averaging circuit includes a second integrator for generating over a second time window a second average power signal in response to the resolver sensor output signals, where the second time window is shorter than the first time window. The comparator circuit compares the first average power signal and the second average power signal and generates a fault signal when the first average power signal and the second average power signal differ by a selected voltage threshold.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion.

Figure 1:
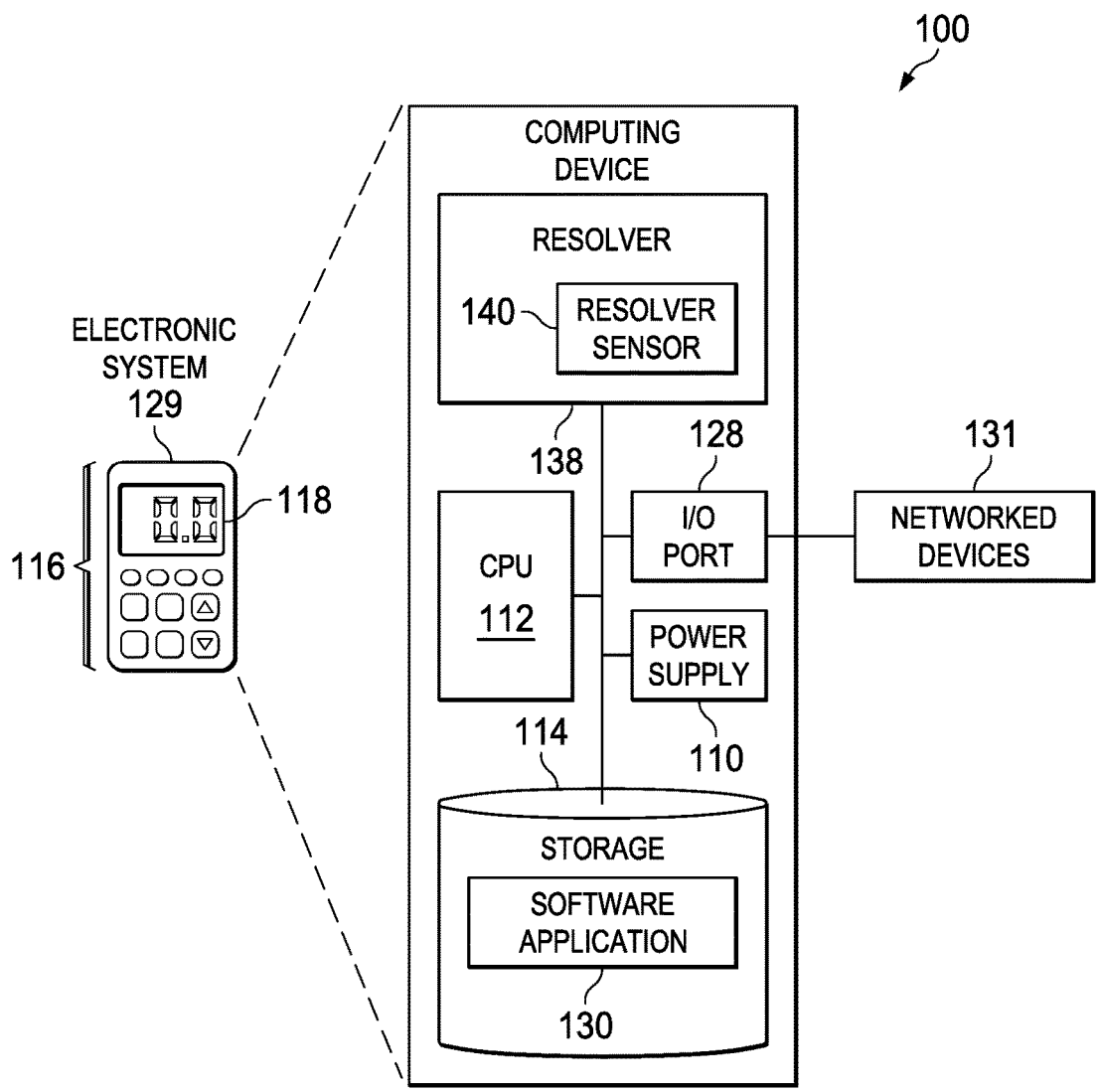
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a computer, electronics control "box" or module, robotics equipment (including fixed or mobile), automobiles or any other type of system where a computer controls physical devices.

In some embodiments, the computing device 100 comprises a megacell or a system-on-chip (SoC) which includes control logic components such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The CPU 112 includes functionality provided by discrete logic components and/or is arranged to execute application-specific instructions (e.g., software or firmware) that, when executed by the CPU 112, transform the CPU 112 into a special-purpose machine. The notional line of "division" between hardware and software is a design choice that (e.g., selectively) varies depending on various tradeoffs including cost, power dissipation, reliability, time to market, and the like. Accordingly, the functionality of any software used to control one or more CPUs 112 of the computing system 100 can be entirely embodied as hardware (e.g., when given sufficient time and resources for design and manufacture).

The storage 114 (which can be memory such as on-processor cache, off-processor cache, RAM, flash memory, data registers, flip-flops, disk storage, and the like) stores one or more software applications 130 (e.g., embedded applications) that, when executed by the CPU 112, transform the computing device 100 into a special-purpose machine suitable for performing a targeted function such as angular resolver imbalance detection.

The CPU 112 comprises memory and logic that store information frequently accessed (e.g., written to and/or read from) from the storage 114. The computing device 100 is often controlled by a user using a UI (user interface) 116, which provides output to and receives input from the user during the execution the software application 130. The output is provided using the display 118, which includes annunciators (such as indicator lights, speakers, vibrators, and the like) and controllers. The input is received using audio and/or video inputs (using, for example, voice or image recognition), and electrical and/or mechanical devices (such as keypads, switches, proximity detectors, gyros, accelerometers, resolvers, and the like).

The CPU 112 is coupled to I/O (Input-Output) port 128, which provides an interface that is configured to receive input from (and/or provide output to) networked devices 131. The networked devices 131 can include any device (including "Bluetooth" units that are electronically paired with the computing device 100) capable of point-to-point and/or networked communications with the computing device 100. The computing device 100 is optionally coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 is accessible, for example, by the networked devices 131. The CPU 112, storage 114, and power supply 110 can be coupled to an external power supply (not shown) or coupled to a local power source (such as a battery, solar cell, alternator, inductive field, fuel cell, capacitor, and the like).

The computing system 100 includes a resolver 138 arranged to receive and evaluate electrical signals (which, for example, convey information) from a resolver sensor 140. As described below, the resolver sensor 140 is arranged to generate and output (at least) first and second resolver sensor output signals for indicating a degree of rotation of a shaft. The first and second resolver sensor output signals are modulated signals, which correspond to, for example, the angular displacement or speed of a rotating shaft (such as the shaft of a motor). The modulated signals ideally have selected peak voltages and are offset by a constant phase angle. The phase angle is ideally around 90 degrees in a two-secondary coils-based resolver-based system, and ideally around 120 degrees in a three-secondary coils-based resolver-based system. (Single-phase and other poly-phase systems are contemplated herein in accordance with the instant disclosure and principles of motors and electromagnetism.)

As disclosed below, a selected phase angle is determined by the number of resolver sensor secondary coils and the phase angle difference between the resolver sensor secondary coils. The selected phase angle is typically determined by the number of resolver sensor phase coils, which allows geometric principles to be applied such that frequencies of an exciter reference signal can be substantially removed (e.g., decoupled) from the modulated signals received from the resolver sensor 140. Substantial removal includes reducing the modulated signals by around 70 percent, which corresponds to a phase angle error of 45 degrees, such that a phase angle of around 45 degrees or more in a two-phase system can be used to detect power imbalances. However, sufficiently high threshold levels (as discussed below with reference to FIG. 16) are used to compensate for the remaining presence (e.g., ripple) of the exciter reference signal (e.g., oscillations) within an average power signal (generated in response to the modulated signals received from the resolver sensor 140).

The resolver 138 evaluates the modulated signals received from the resolver sensor 140 to determine the angle and/or velocity of the motor shaft. The resolver 138 also includes diagnostic circuitry to determine whether the received modulated signals are balanced (e.g., unaffected by electrical noise and/or winding defects). The received modulated signal are balanced, for example, when the received modulated signals have peak voltages in accordance with selected peak voltages and/or are separated by the constant phase angle such that an angle of rotation of a shaft (e.g., which contains a coil for inductively transmitting the exciter reference signal) can be resolved (e.g., determined).

When the received modulated signals are not balanced, for example, errors in resolving the angle of rotation of the shaft can occur. To help minimize the possibility of generating control signals in response to erroneous information (and, for example to increase speed and resolution of the resolver signal processing), the resolver 138 is arranged to generate a fault signal indicating the received modulated signals are not balanced. The fault signal is typically coupled to a processor, such as CPU 112, such that the processor can take action to provide special handling (including ignoring) of the received modulated signals.

In an embodiment, the resolver 138 receives sine/cosine modulated signals Vin1 and Vin2 (where Vin1=V1*cos(θ)

sin(ωt) and Vin2=V2*sin(θ)sin(ωt)). The modulated signals are typically less than around 15 kHz, although in accordance with the teachings herein, the modulated signals Vin1 and Vin2 are not limited to frequencies of less than around 15 kHz because (for example) of the disclosed decoupling of the modulation frequencies. The resolver 138 is arranged to resolve and convert the resolving angle θ of Vin1 and Vin2 into digital words (e.g., 10-bit or 12-bit words) representing motor angle and/or velocity (e.g., such that the speed and/or instantaneous position of the shaft can be conveyed). In the embodiment, the two input (e.g., enveloping) peak voltages of Vin1 and Vin2 should ideally be the same. Any deviation and/or imbalance between the input Vin1 and Vin2 signals (e.g., that exceeds a respective tolerance for offset, offset drift, distortion, glitch, noise and the like) is considered to cause errors in the resolving angle θ, and accordingly is reported as a fault (e.g., via the error signal).

However, comparing the peak and/or valley voltages between the Vin1 and Vin2 signals is not necessarily straightforward because the peak and valley voltages of each of the Vin1 and Vin2 signals occur at different times and depend on motor speed and position. In a first example, the nominal input signal amplitudes V1 and V2 (of Vin1 and Vin2, respectively), as well as offset drift, distortion, noise, and the like are all amplitude-modulated by the term sin(ωt) in accordance with typical resolver sensor operation. When the shaft of the resolver motor spins very slowly or even stops, a fault can be generated. When the shaft stops (e.g., at an angle θ such as 0 degrees), one channel (e.g., Vin1) is full scale (e.g., peak voltage) and the other channel (e.g., Vin2) is zero such that conventional solutions (such as peak detectors) often fail to effectively detect any waveform deviation and/or deflections. In contrast, the disclosed resolver 138 is arranged to properly detect and report errors (e.g., power imbalances in the input signal amplitudes V1 and V2) when the shaft is rotating relatively slowly or is not rotating (e.g., stopped).

In a second example, the Vin1 and Vin2 signals received from the resolver sensor 140 can be noisy, corrupted, and/or distorted (collectively "degraded"). Vin1 and Vin2 signals can become degraded before being received by the resolver 138 because the resolver sensor 140 is normally placed in position that is external (e.g., separate) from the resolver 138 such that the Vin1 and Vin2 signals are subjected to electromagnetic interference (EMI) before being connected to (for example, the shielded integrated circuit of) the resolver 138.

Because of the EMI-induced degradation, the received Vin1 and the Vin2 signals are often appropriately signal-conditioned (e.g., adjust gained and/or attenuation) and filtered. However, the EMI would also degrade any reference signal used for comparisons such that the induced degradations to the received Vin1 and the Vin2 signals can be corrected (e.g., such that no substantially ideal reference signal is readily available for comparison due to the EMI). Further, a customer (e.g., a user of a post-deployment system) might adaptively adjust input signal levels for a better dynamic range, however, this typically would further increase the complexity of generating a substantially ideal reference signal.

The disclosed resolver 138 is arranged to perform angular resolver imbalance detection and fault reporting of the received sin(ωt)- or cos(ωt)-modulated sensor signals irrespective of EMI-induce noise degradation, signal gain, any amplitude imbalance between the cosine and sine signals of the received sensor signals.

Figure 2:
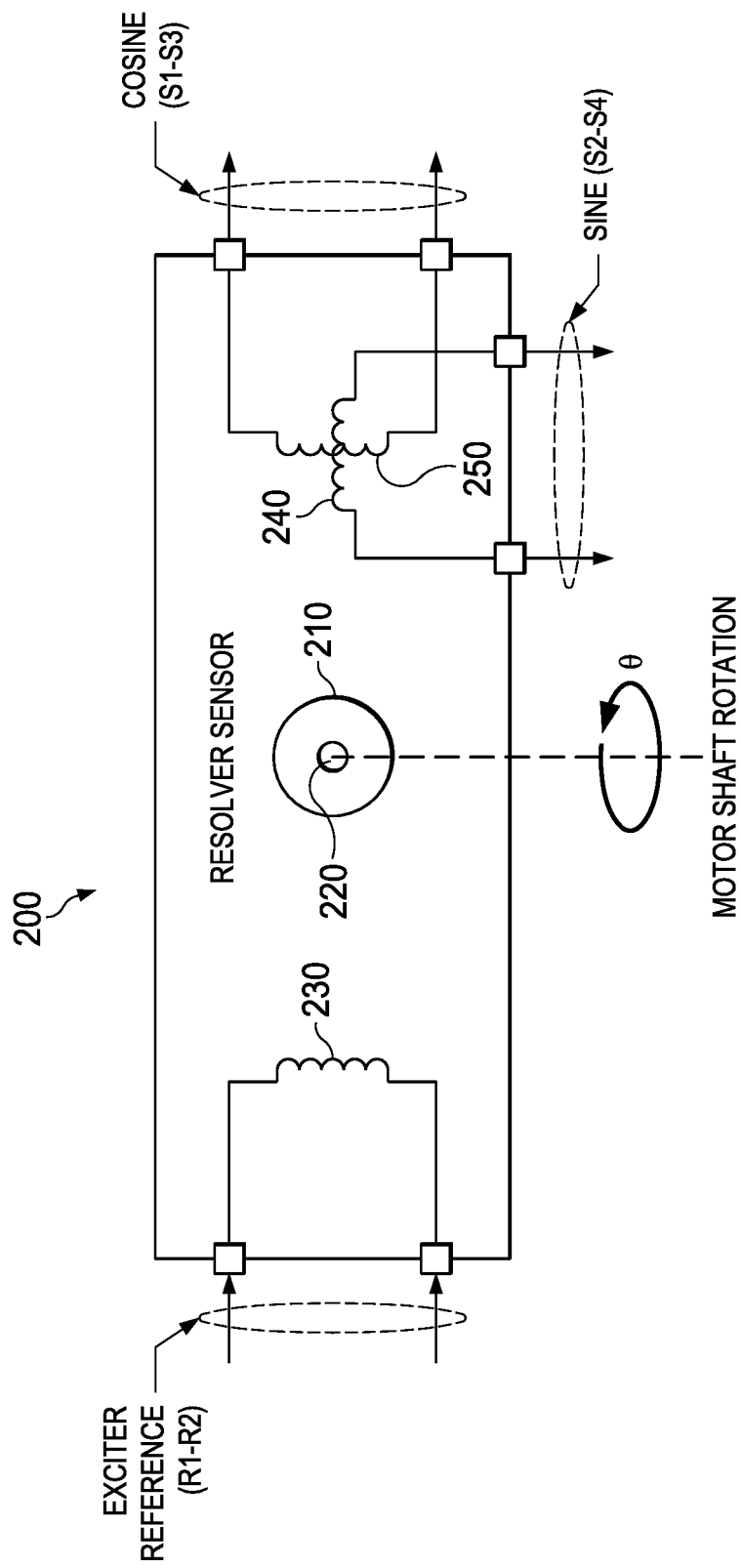
FIG. 2 is a schematic diagram illustrating a resolver sensor.

FIG. 2 is a schematic diagram of a resolver sensor. Resolver sensor 200 is a resolver sensor such as resolver sensor 140 and is typically integrated with a motor 210. The resolver sensor 200 includes exciter reference (input) terminals R1 and R2, sine (output) terminals S2 and S4, and cosine (output) terminals S1 and S3. Generally, the resolver sensor 200 is arranged to generate, in response to an exciter reference signal (e.g., via terminals R1 and R2), a first output signal (e.g., via S2 and S4) and a second output signal (e.g., via S1 and S3). The generated first and second output signals are analog output signals for conveying rotation information for determining a rotation (including a position and/or speed) of the motor shaft 220 of motor 210.

The resolver sensor 200 is an angular position sensor, which is commonly used in harsh, rugged environments. A fully electric vehicle (EV) or industry robots typically use one or more resolver sensors 200 for a variety of control systems that perform rotary and/or angular motion. In embodiments employing digital signal processing, a resolver-to-digital converter (RDC) interface processes the analog output signals output by the resolver sensor 200 and converts the rotation information of the analog output signals to a digital format. The digitally formatted rotation information is communicated, for example, to the engine control unit (ECU) in an EV or to other micro-controllers/microprocessors in certain industrial robots control systems where determination of the angular position and/or velocity of the motor shaft 220 is required for normal processing.

Typically, the resolver sensor 200 is mechanically affixed on the motor shaft 220 of the motor 210, for which both relative and absolute angular position for the motor shaft 220 are to be continuously determined. As illustrated, the resolver sensor 200 is embodied as a rotating autotransformer having one rotor winding (e.g., coil 230), which is driven by an exciter sine wave via terminals R1 and R2. The rotor winding 230 is arranged about the motor shaft 220, which accordingly rotates as the motor 210 is running (e.g., "spinning"). The resolver sensor 200 also includes two secondary windings (coils 240 and 250) that are mechanically placed 90 degrees apart (other phase angle placements are possible, such as 120 degrees for a 3-phase resolver sensor). The secondary coils 240 and 250 are coupled respectively to sine (S2 and S4) and the cosine (S1 and S3) terminals. The exciter signal applied to the primary coil is AC-coupled (e.g., inductively coupled) to the two stator windings. As the rotor spins (e.g., rotates), the rotor position angle (Θ) changes with respect to the stator windings. The rotor and stator windings have a turn ratio around the order of 30 percent (for example). The resulting amplitude modulated signals shown in FIG. 3 (described below) are typical resolver sensor 200 output signals. Resolver sensor 200 output signals are normally "gained" (e.g., selectively amplified), demodulated, and post-processed to extract angle and velocity information related to the motor shaft 220.

Figure 3:
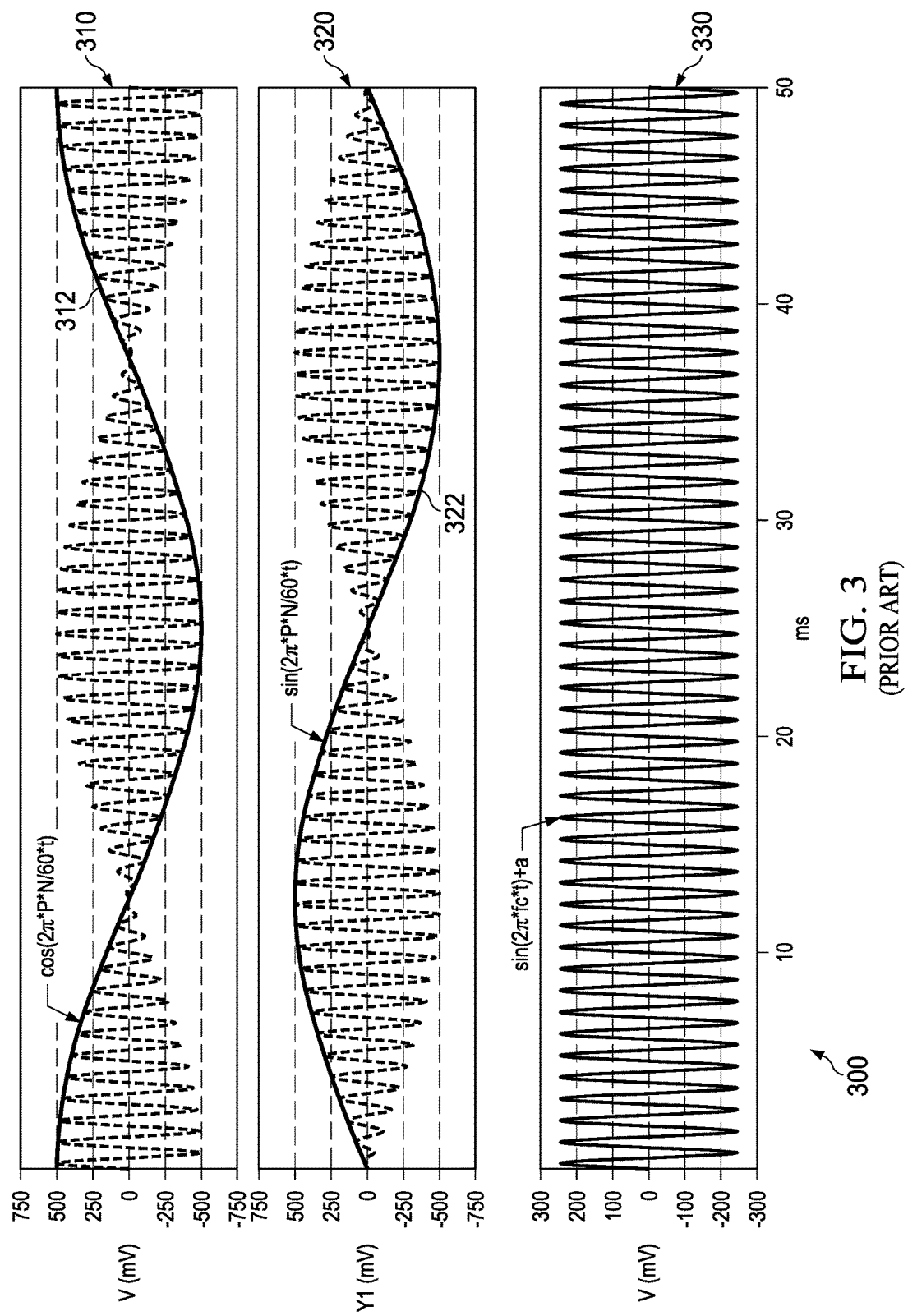
FIG. 3 is a waveform diagram 300 illustrating an exciter reference signal and the first and second output signals received from the resolver sensor.

FIG. 3 is a waveform diagram 300 illustrating an exciter reference signal and the first and second output signals received from the resolver sensor 200. The exciter reference signal 330 is a double-ended (e.g., differential) signal generated by the resolver applied to the resolver sensor 200. The exciter reference signal 330 is generated by resolver 138 waveform generation circuitry and applied across the R1 and R2 terminals of the resolver sensor 200. The exciter reference signal 330 has a waveform in accordance with the equation sin(2π×fc×t)+a where fc is the excitation frequency, a is the common-mode amplitude (which is a constant), and t is time.

The first (e.g., cosine) output signal 310 is a double-ended signal generated by the resolver sensor in response to inductive coupling of the exciter reference signal 330 from the (rotor) coil 230 to the second (stator) coil 250. The generated first output signal 310 is coupled across the S1 and S3 terminals of the resolver sensor 200. The resolver sensor 200 generates first (e.g., cosine) output signal 310 having a first sinusoidal envelope 312 in accordance with the equation sin(2π×P×N/60×t) where P indicates a number of poles of resolver sensor 200, N indicates the rpm (rotations per minute), and t is time.

The second (e.g., sine) output signal 320 is a double-ended signal generated by the resolver sensor in response to inductive coupling of the exciter reference signal 330 from the (rotor) coil 230 to the first (stator) coil 240. The generated second output signal 320 is coupled across the S2 and S4 terminals of the resolver sensor 200. The resolver sensor 200 generates second (e.g., sine) output signal 320 having a second sinusoidal envelope 322 in accordance with the equation sin(2π×P×N/60×t) where P indicates a number of poles of resolver sensor 200, N indicates the rpm (rotations per minute), and t is time. For example, the angle (θ) of the motor rotation can be determined by evaluating the arc-tangent function of the result of dividing the first sinusoidal envelope 322 divided by the instantaneous value by the second sinusoidal envelope 312.

Figure 4:
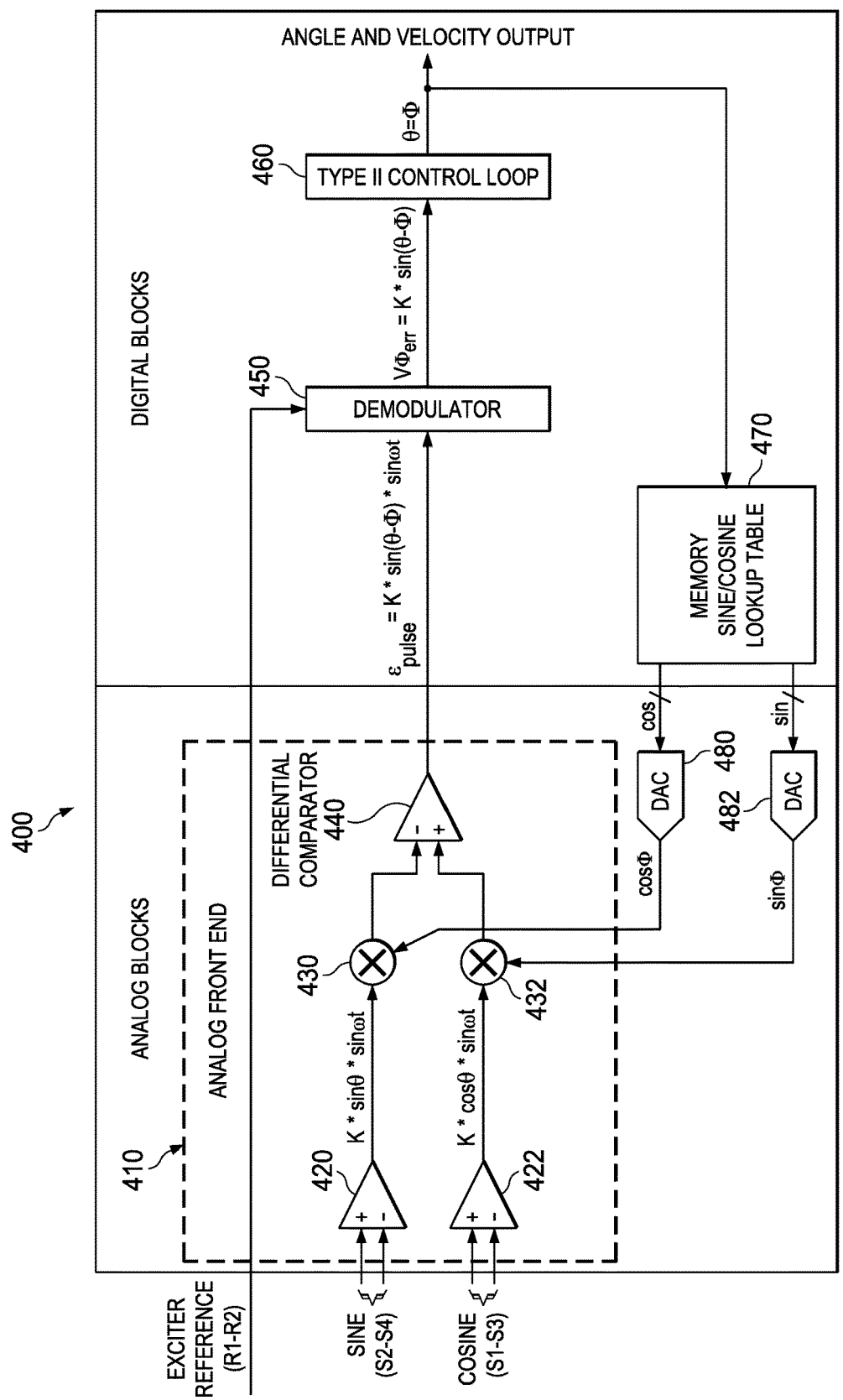
FIG. 4 is a high-level diagram illustrating an architecture of a digital feedback loop tracking resolver.

FIG. 4 is a high-level diagram illustrating an architecture of a digital feedback loop tracking resolver. The digital feedback loop tracking resolver 400 includes an analog front end 410 (which includes differential input buffers 420 and 422, multipliers 430 and 432 and a differential comparator 440), digital blocks (which include the demodulator 450, the "type II" control loop 460 (e.g., having two "poles"—one at the origin—and one "zero," where the zero is located between the two poles: such a compensation network helps shape the profile of the gain with respect to frequency while also providing a 90° phase boost), and the memory sine/cosine lookup table 470, and the digital-to-analog converters (DACs) 480 and 482.

The analog front end 410 is arranged to convert (e.g., via the differential input buffers 420 and 422) the sine and cosine differential input signals into respective "single-ended" signals given by equations (1) and (2) respectively:

$$\text{Sine}(S2-S4)=\sin(\Theta)*\sin(\omega*t) \quad (1)$$

$$\text{Cosine}(S1-S3)=\cos(\Theta)*\sin(\omega*t) \quad (2)$$

where Θ is the motor shaft angle and ω is the excitation frequency applied at R1-R2.

The amplitude-modulated resolver output signals of equation (1) and (2) are fed as the inputs to the digital feedback loop tracking resolver 400. A purpose of the digital feedback loop tracking resolver 400 loop is to calculate the angle (Θ) and velocity of the motor shaft. As indicated by FIG. 3, the positioning information is conveyed via the envelope of the input sine and cosine signals. In order to calculate the conveyed angle, sine Θ is multiplied by a feedback signal (cosine Φ from DAC 480) where phi(Φ) is the assumed angle resulting from the lookup table stored in memory. Similarly, cosine Θ is multiplied by the feedback signal (sine Φ from DAC 482). Accordingly, the multipliers 430 and 432 are used to generate the trigonometric function (sin A*Cos B–Sin B Cos A), which equates with Sin (A–B) per trigonometric identities:

$$a - b = K*\sin(\Theta)*\sin(\omega*t)*\cos(\Phi) - \quad (3)$$
$$K*\cos(\Theta)*\sin(\omega*t)*\sin(\Phi) \quad (4)$$
$$= K*\sin(\omega*t)*(\sin(\Theta)*\cos(\Phi) - \cos(\Theta)*\sin(\Phi))$$
$$= K*\sin(\omega*t)*\sin(\Theta - \Phi) \quad (5)$$

where Φ=is an approximation of the angle of the motor shaft 220 and K is a constant.

The output of the differential comparator 440 is digital and is demodulated by demodulator 450 to remove the carrier wave sin(ω*t). In order to determine the carrier wave sin(ω*t) information, the demodulator 450 generates the error signal $V_{\Phi ERR}$ in response to the exciter reference signal. The error signal $V_{\Phi ERR}$ is applied to the type-II (digital tracking) control loop 460 to convert the error signal $K_{\Phi ERR}$ into an output signal for indicating the angle and velocity:

$$V_{\Phi ERR}=K*\sin(w*t)*(\Theta-\Phi) \quad (6)$$

Negative feedback of the control loop configuration employed in the digital feedback loop tracking resolver architecture helps to continuously reduce the $V_{\Phi ERR}$ signal to a value substantially close to zero. For relatively small values of (Θ−1), the value of $V_{\Phi ERR}$ is near zero. When sin (A−B)≈0, then A≈B. Accordingly, the digital feedback loop continuously self-corrects by maintaining the error close to zero such that the assumed angle (Φ) is equal to the angle (Θ) of the shaft 220, Accordingly, when the digital control loop is tracking:

$$\Theta=\Phi \quad (7)$$

from which it can be determined (e.g., inferred) the assumed approximate angle is substantially equal to the rotor shaft angle.

Figure 5:
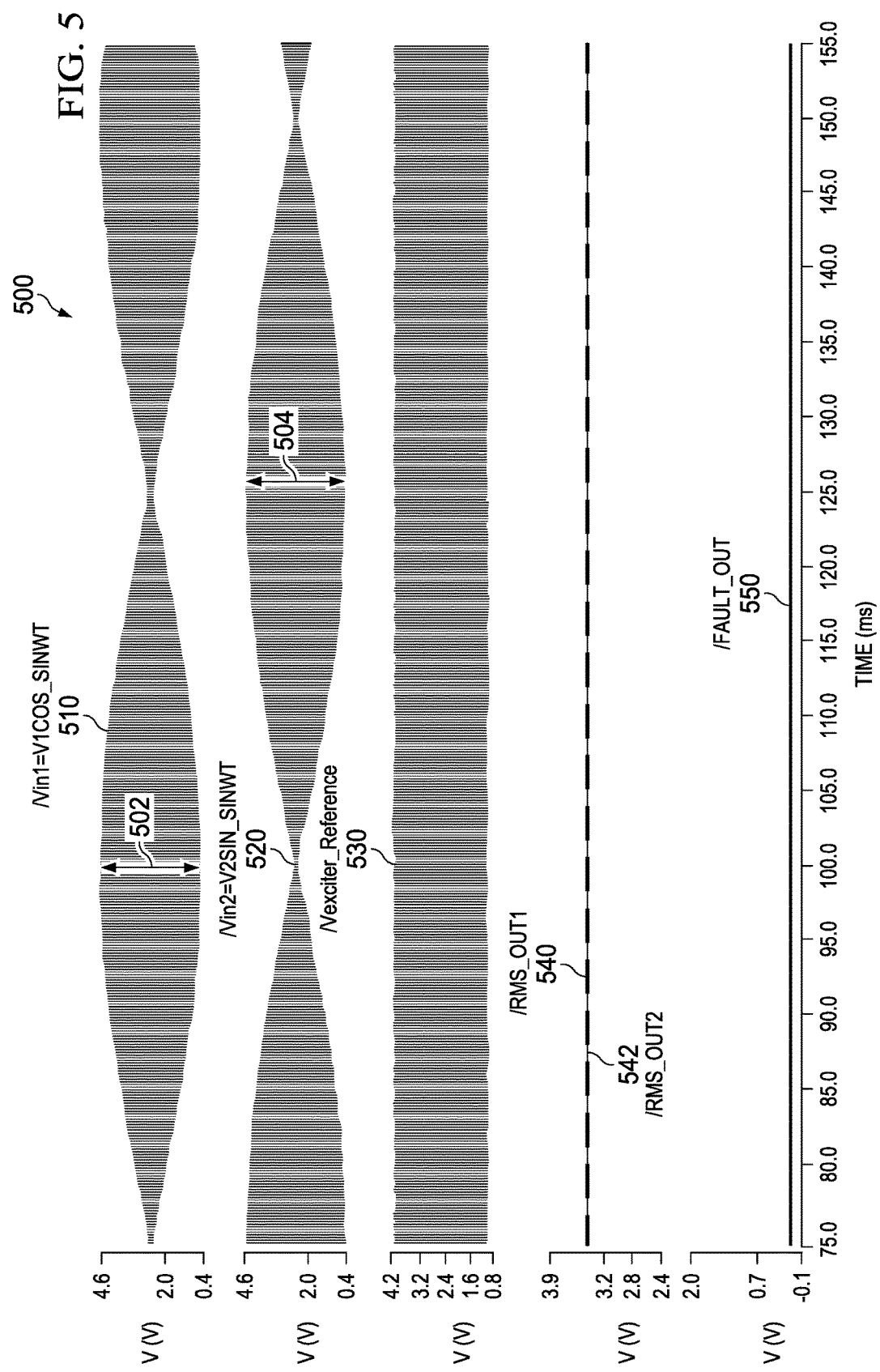
FIG. 5 is a waveform diagram 500 illustrating ideal first and second output signals received from a resolver sensor in accordance with embodiments of the present disclosure.

FIG. 5 is a waveform diagram 500 illustrating ideal first and second output signals received from a resolver sensor in accordance with embodiments of the present disclosure. The waveform diagram 500 includes an ideal first (cosine) output signal 510 received from an ideal resolver sensor, an ideal second (sine) output signal 520 received from an ideal resolver sensor, an ideal exciter reference signal 530 applied to the ideal resolver sensor, a first (e.g., longer window) voltage RMS (root mean square) output 540, a second (e.g., shorter window) voltage RMS output 542, and a fault signal 550 (e.g., for indicating when the first and second RMS output voltages deviate). The fault signal 550 is generated by the disclosed resolver 138 for example, and is discussed below with reference to FIG. 16.

The voltage peak-to-peak (Vpk-pk) 502 of the ideal first (cosine) output signal 510 and the Vpk-pk 504 ideal second (sine) output signal 520, being ideal, are identical even though the respective peak-to-peak voltage of each such signal occurs at different times (e.g., phase offset and motor rotation speed). For example, respective peak-to-peak voltages of the first (cosine) output signal 510 occurs when the phase angle is near 0°, 180°, 360°, and the like, whereas the peak-to-peak voltages of the second (sine) output signal 520 occurs when the phase angle is near 90°, 270°, and the like. The peak-to-peak voltages normally occur near (rather than exactly on) a selected phase angle because the peak-to-peak voltages are normally generated in accordance with the instantaneous orientation of the motor shaft and speed.

Because the ideal first (cosine) output signal 510 and the ideal second (sine) output signal 520 are both ideal, the first (e.g., longer window) voltage RMS (root mean square) output 540 and the second (e.g., shorter window) voltage RMS output 542 are also ideal. For example, both the first (e.g., longer window) voltage RMS output 540 and the second (e.g., shorter window) voltage RMS output 542 are the RMS of the ideal voltage peak-to-peak. Because the first (e.g., longer window) voltage RMS output 540 and the second (e.g., shorter window) voltage RMS output 542 are identical (and accordingly are illustrated as being superimposed), the fault signal (e.g., for indicating when the first and second RMS output voltages deviate) is held to an unasserted (logic zero) value.

Figure 6:
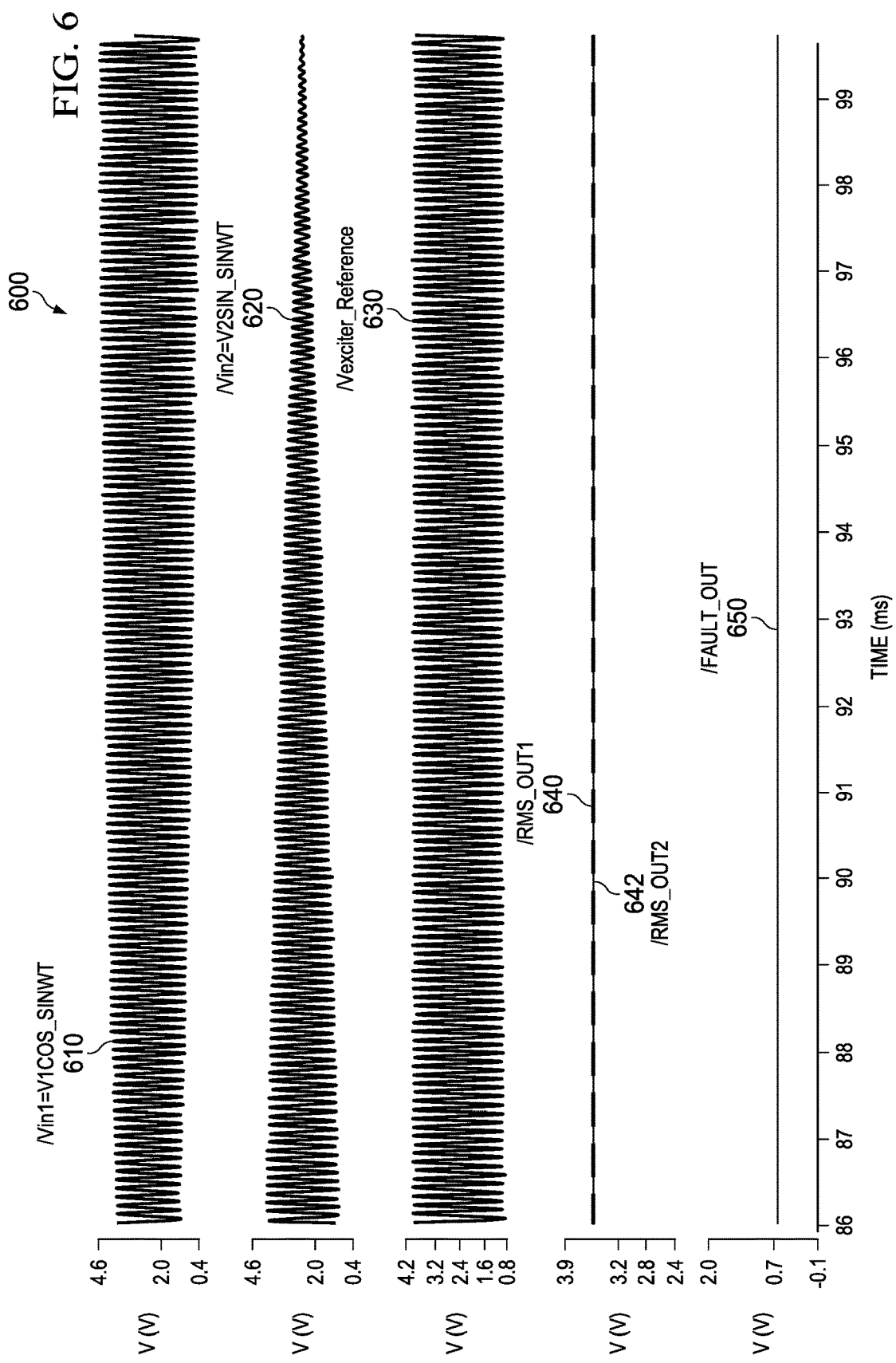
FIG. 6 is a waveform diagram 600 illustrating finer details of ideal first and second output signals received from a resolver sensor in accordance with embodiments of the present disclosure.

FIG. 6 is a waveform diagram 600 illustrating finer details of ideal first and second output signals received from a resolver sensor in accordance with embodiments of the present disclosure. The waveform diagram 600 includes an ideal first (cosine) output signal 610, an ideal second (sine) output signal 620, an ideal exciter reference signal 630, a first (e.g., longer window) voltage RMS output 640, a second (e.g., shorter window) voltage RMS output 642, and a fault signal 650.

As illustrated in finer detail (e.g., zoomed in), each individual (e.g., sinewave) oscillation of the ideal first (cosine) output signal 610 and the ideal second (sine) output signal 620 generally can be perceived. It can be seen, over the illustrated time, peak-to-peak voltages of the ideal first (cosine) output signal 610 approach a maximum value around time 100 mS (e.g., when the cosine phase angle is near 0°). In similar fashion (e.g., in accordance with the offset 90° offset between the sine and cosine functions, per se), the peak-to-peak voltages of the second (sine) output signal 620 approach a minimum value (e.g., zero) around time 100 mS (e.g., when the sine phase angle is near 0°).

Figure 7:
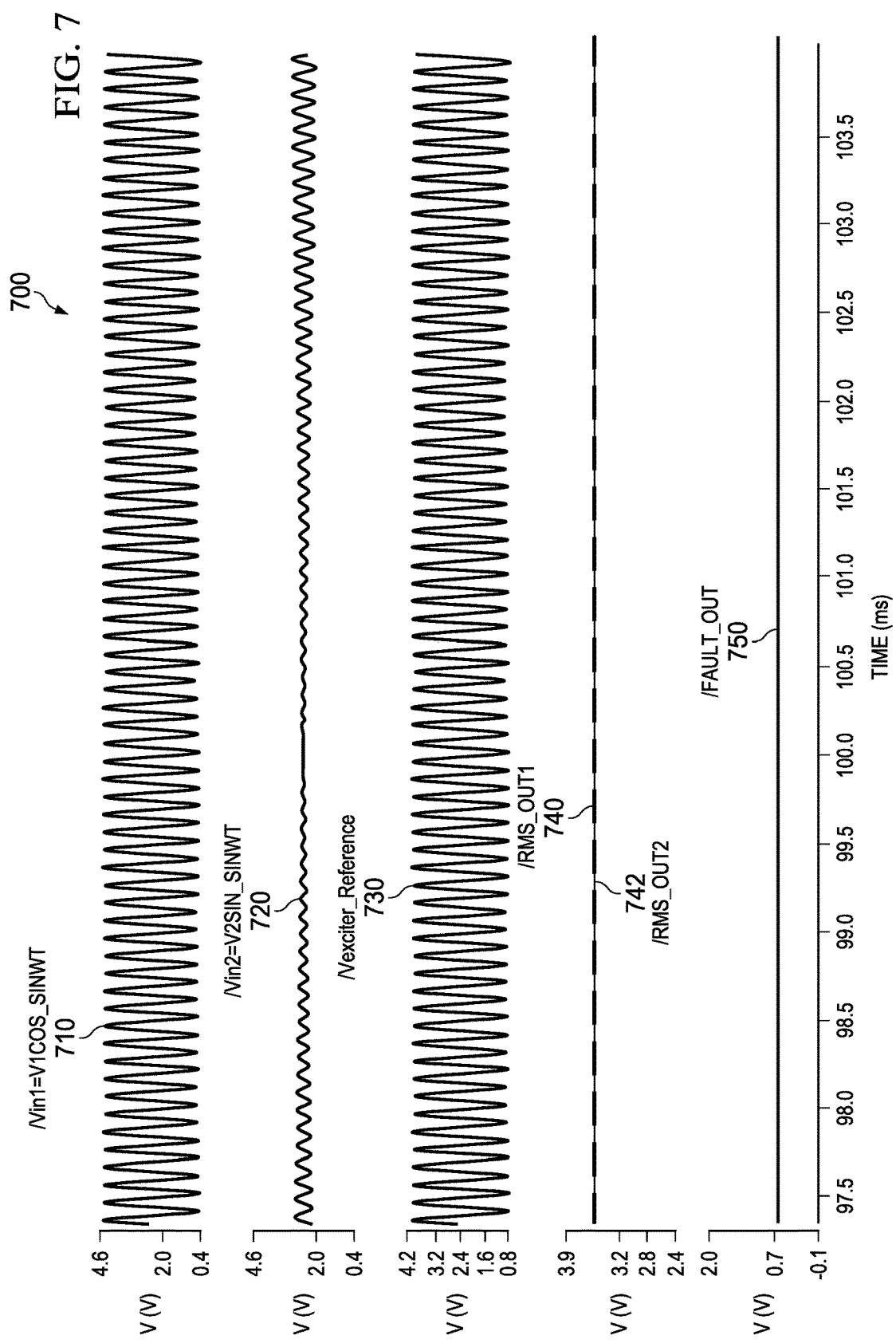
FIG. 7 is a waveform diagram 700 illustrating even finer details of ideal first and second output signals received from a resolver sensor in accordance with embodiments of the present disclosure.

FIG. 7 is a waveform diagram 700 illustrating even finer details of ideal first and second output signals received from a resolver sensor in accordance with embodiments of the present disclosure. The waveform diagram 700 includes an ideal first (cosine) output signal 710, an ideal second (sine) output signal 720, an ideal exciter reference signal 730, a first (e.g., longer window) voltage RMS output 740, a second (e.g., shorter window) voltage RMS output 742, and a fault signal 750.

As illustrated in even finer detail, each individual (e.g., sinewave) oscillation of the ideal first (cosine) output signal 710 and the ideal second (sine) output signal 720 is generally discernable. It can be seen, over the illustrated time, peak-to-peak voltages of the ideal first (cosine) output signal 710 approach a maximum value around time 100 mS (e.g., when the cosine phase angle is near 0°). In similar fashion, the peak-to-peak voltages of the second (sine) output signal 720 approach a minimum value (e.g., zero) around time 100 mS (e.g., having a generally flat-like appearance around time 100 mS).

Figure 8:
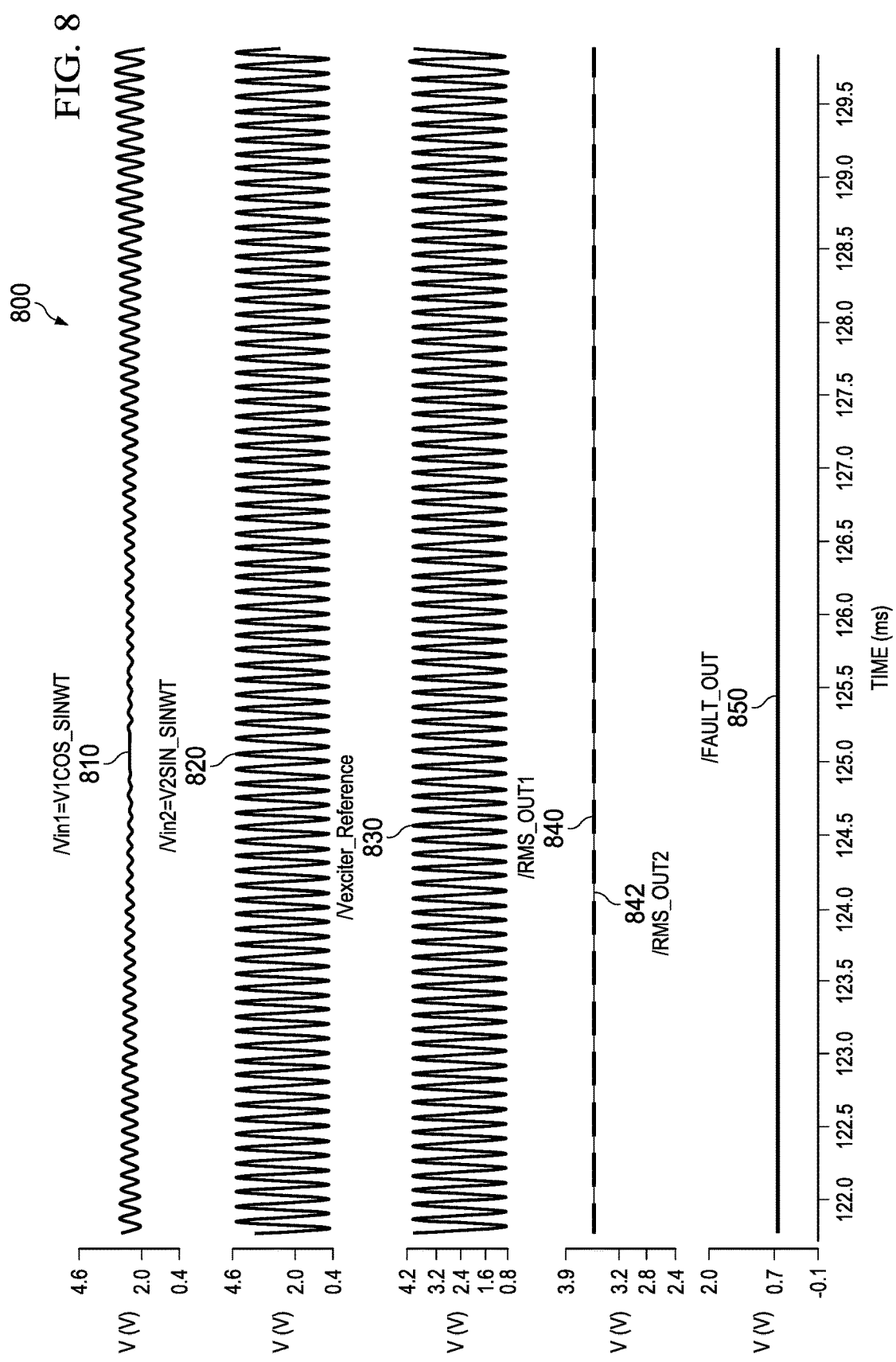
FIG. 8 is a waveform diagram 800 illustrating fine details of ideal first and second output signals received from a resolver sensor at a different time in accordance with embodiments of the present disclosure.

FIG. 8 is a waveform diagram 800 illustrating fine details of ideal first and second output signals received from a resolver sensor at a different time in accordance with embodiments of the present disclosure. The waveform diagram 800 includes an ideal first (cosine) output signal 810, an ideal second (sine) output signal 820, an ideal exciter reference signal 830, a first (e.g., longer window) voltage RMS output 840, a second (e.g., shorter window) voltage RMS output 842, and a fault signal 850.

As illustrated in detail, each individual (e.g., sinusoidal) oscillation of the ideal first (cosine) output signal 810 and the ideal second (sine) output signal 820 is generally discernable. It can be seen, over the illustrated time period, peak-to-peak voltages of the ideal first (cosine) output signal 810 approach a minimum value (e.g., zero) around time 124.8 mS (e.g., when the phase angle is near 90°). In accordance with the sine-cosine relationship, the peak-to-peak voltages of the second (sine) output signal 820 approaches a maximum value around time 124.8 mS (e.g., when the phase angle is near 90°).

As illustrated by waveforms of FIG. 7 and FIG. 8, the maximum peaks of the ideal first (cosine) output signal and the ideal second (sine) output signal occur at different intervals. The spacing of such intervals is dependent upon the rotational speed of the motor being monitored by a disclosed resolver.

Figure 9:
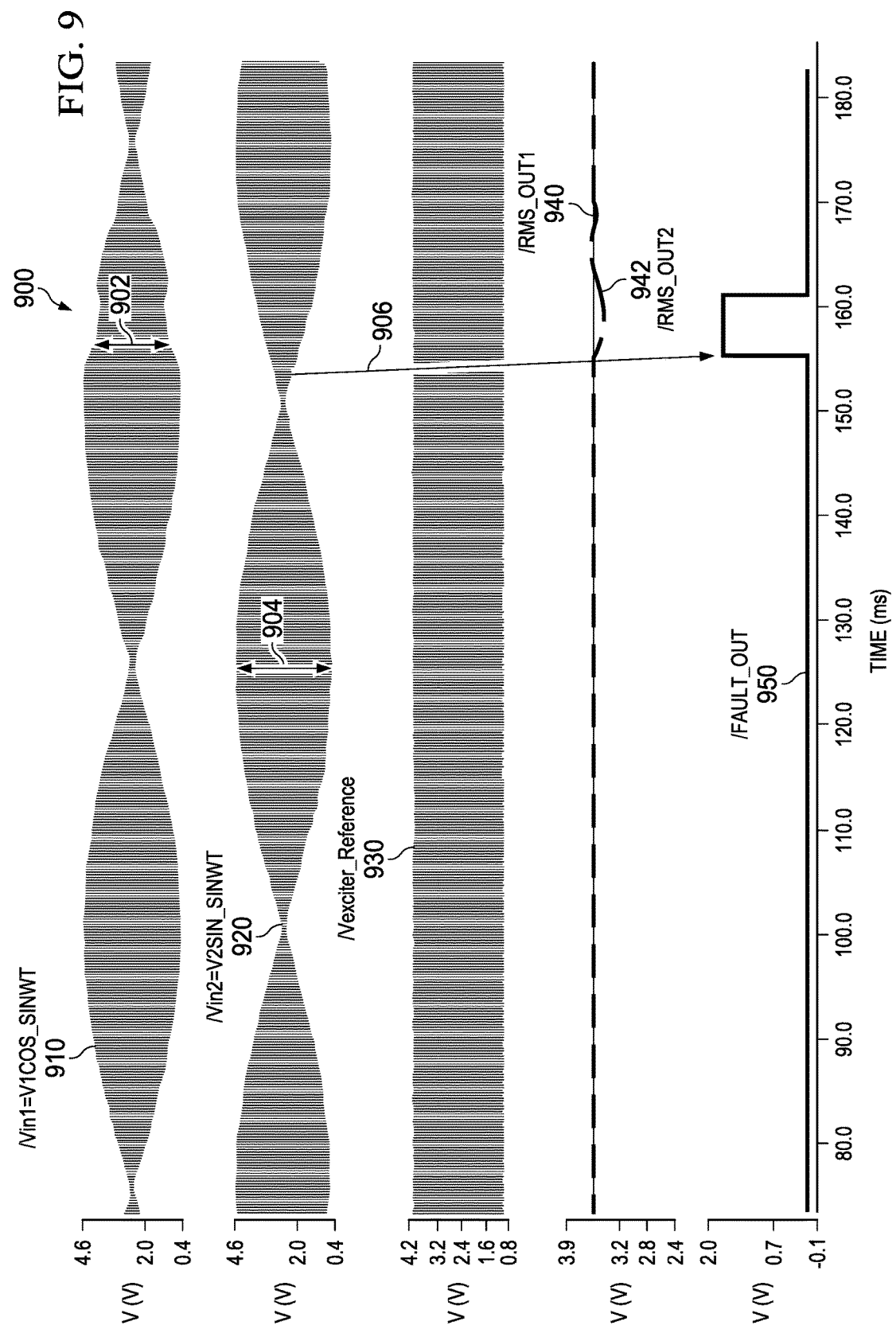
FIG. 9 is a waveform diagram 900 illustrating imbalanced first and second output signals received from a resolver sensor in accordance with embodiments of the present disclosure.

FIG. 9 is a waveform diagram 900 illustrating imbalanced first and second output signals received from a resolver sensor in accordance with embodiments of the present disclosure. The waveform diagram 900 includes a (e.g., degraded) first (cosine) output signal 910, a second (sine) output signal 920, an exciter reference signal 930, a first (e.g., longer window) voltage RMS output 940, a second (e.g., shorter window) voltage RMS output 942, and a fault signal 950.

As illustrated, the first (cosine) output signal 910 is non-ideal as a result, for example, of noise being injected into the resolver sensor at around a time of 155 mS. The noise can result from the motor itself (which in many common electric vehicles can consume around 10-40 amps of current) and/or control circuitry (e.g., for selectively powering motive windings of the motor coil). Typically, as long as the noise is equally injected into both the sine and cosine signals, common mode rejection of resolver system 138 (e.g., which is inherent to the differential signals) reduces the effects of the noise to a resolver system. When the noise disproportionally affects one of the sine or cosine signals, conventional resolver systems can make a substantially incorrect angle determination (e.g., depending on the degree of the disproportionality and the tolerances of a particular application).

Additionally, the first (cosine) output signal 910 can be non-ideal as a result, for example, of a defect in the resolver sensor generating the output signal received from a resolver sensor. Resolver sensors are typically include multiple poles and/or windings. When adjacent portions of insulation of individual turns are comprised, individual turns having adjacent, compromised insulation can be shorted (e.g., directly or indirectly). When the shorted turns occur in a winding, the shorted turns result in the winding causing a dip in amplitude of an output signal of the resolver sensor. The dip 902 (e.g., with respect to Vpk-pk 904) in amplitude reduces the angular accuracy of conventional resolver systems and, depending for example on the tolerances of a particular application, the stability (e.g., "lock") of resolver feedback loop could be broken.

The disproportionality of the effect(s) of noise or faulty windings or other mechanical imperfections in the resolver sensor that result in an amplitude to reduce in (for example) only one of the signals, causes an imbalance, which potentially can result in incorrect shaft angle readings and/or destabilized feedback control loops. In the disclosed resolver 138, the imbalance is detected as a function of comparing and thresholding (e.g., see comparators 1662 and 1664 discussed below) the first (e.g., longer window) voltage RMS output 940 and the second (e.g., shorter window) voltage RMS output 942. When the (e.g., magnitude of the) difference between the first (e.g., longer window) voltage RMS output 940 and the second (e.g., shorter window) voltage RMS output 942 exceeds a programmably selected threshold (e.g., see programmable voltage dividers 1654 and 1658 discussed below), the resolver asserts (e.g., 906) the fault signal 950 around the time of 155 mS.

Figure 10:
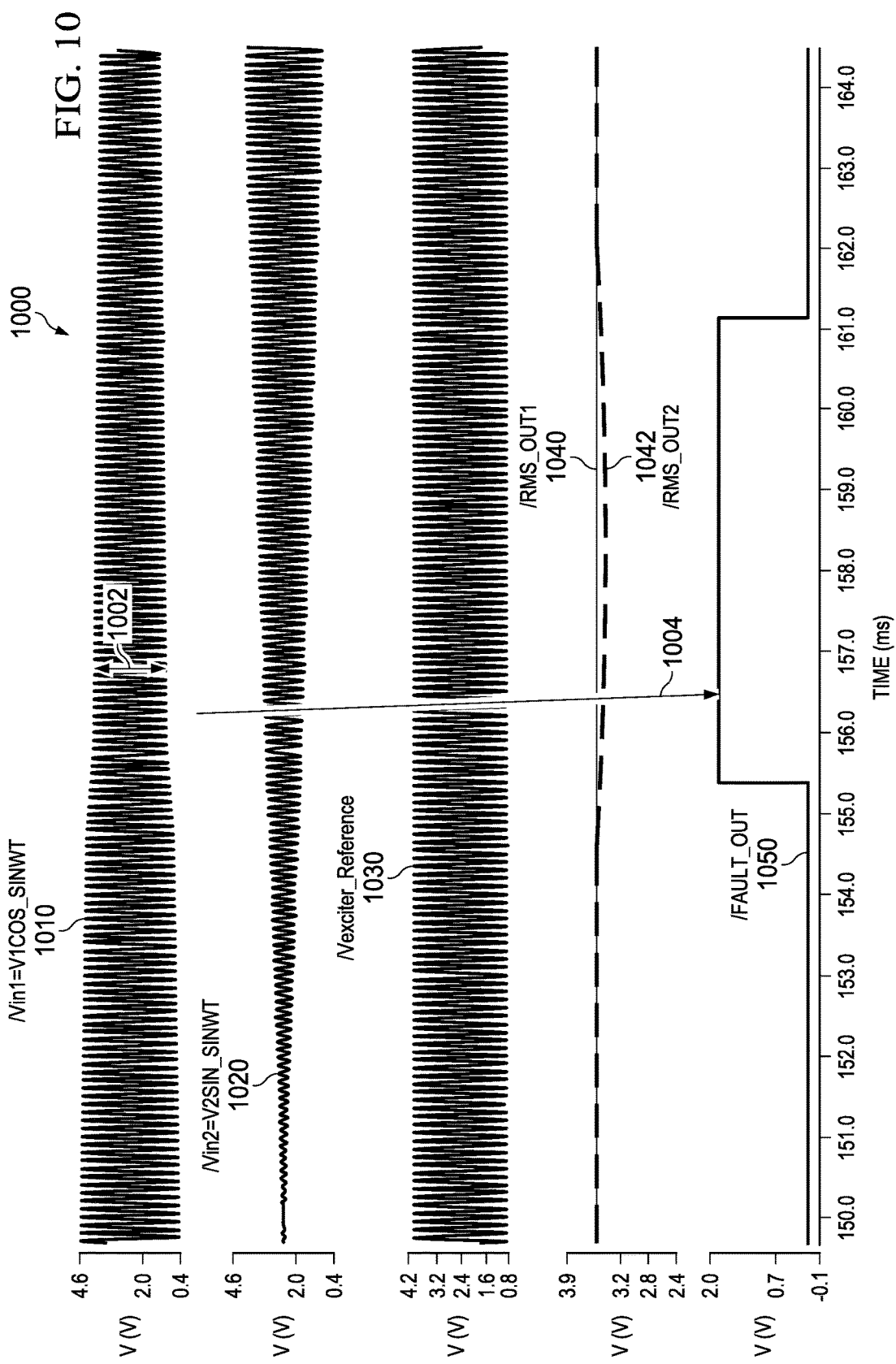
FIG. 10 is a waveform diagram 1000 illustrating finer details of imbalanced first and second output signals received from a resolver sensor in accordance with embodiments of the present disclosure.

FIG. 10 is a waveform diagram 1000 illustrating finer details of imbalanced first and second output signals received from a resolver sensor in accordance with embodiments of the present disclosure. The waveform diagram 1000 includes a (e.g., degraded) first (cosine) output signal 1010, a second (sine) output signal 1020, an exciter reference signal 1030, a first (e.g., longer window) voltage RMS output 1040, a second (e.g., shorter window) voltage RMS output 1042, and a fault signal 1050.

Around time 155 mS, noise and/or a winding fault (for example), causes a drop 1002 in the instantaneous peak-to-peak voltage of the first (e.g., cosine) voltage output signal 1010. The disclosed resolver 138 generates the first (e.g., longer window) voltage RMS output 1040 in response to integrating the first (e.g., cosine) voltage output signal 1010 and the second (e.g., sine) voltage output signal over a longer window (e.g., 20-times longer than the shorter window). Likewise the disclosed resolver 138 generates the second (e.g., shorter window) voltage RMS output 1042 in response to integrating the first (e.g., cosine) voltage output signal 1010 and the second (e.g., sine) voltage output signal 1020 over a shorter window (e.g., 20-times shorter than the longer window).

Accordingly, the value of the second (e.g., shorter window) voltage RMS output 1042 falls (more quickly than the RMS output 1040) in response to the drop 1002 in the peak-to-peak voltage of the first (e.g., cosine) voltage output signal 1010. The lowered value of the second (e.g., shorter window) voltage RMS output 1042 is discernable near time 155, where the (e.g., power) value of the second (e.g., shorter window) voltage RMS output 1042 diverges (e.g., becomes less than) the corresponding value of the first (e.g., longer window) voltage RMS output 1040. When the (e.g., magnitude of the) difference between the first (e.g., longer window) voltage RMS output 1040 and the second (e.g., shorter window) voltage RMS output 1042 exceeds a programmably selected threshold, the resolver 138 asserts (e.g., 1004) the fault signal 1050 around the time of 155 mS.

After time 155 mS, the rotation of the motor shaft (and/or cessation of noise, for example) causes the instantaneous peak-to-peak voltage of the first (e.g., cosine) voltage output signal 1010 to (e.g., gradually) rise to a normal (e.g., non-error) value. When the (e.g., magnitude of the) difference between the first (e.g., longer window) voltage RMS output 1040 and the second (e.g., shorter window) voltage RMS output 1042 falls below the programmably selected threshold, the resolver 138 deasserts the fault signal 1050 around the time of 161 mS.

Figure 11:
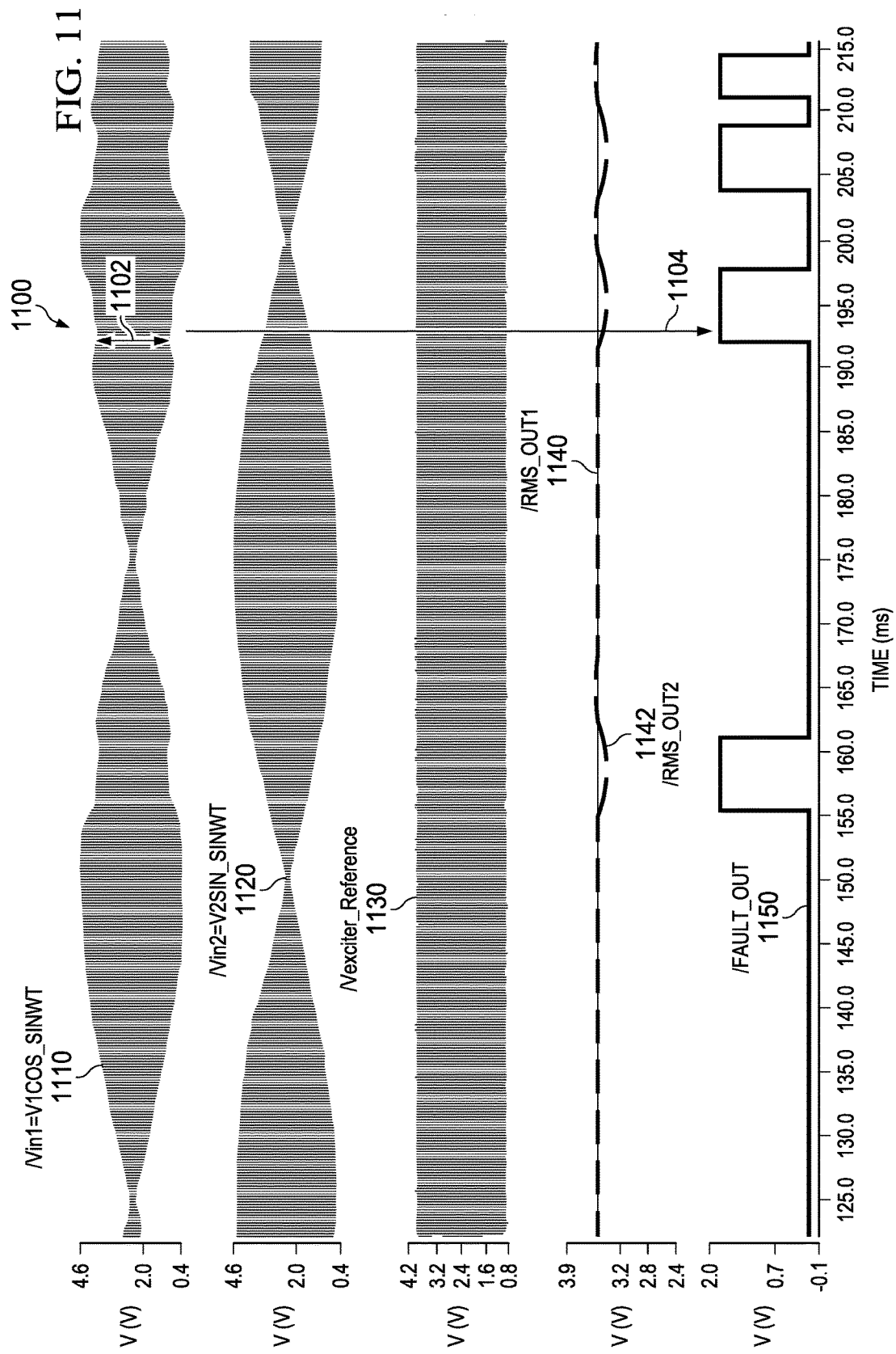
FIG. 11 is a waveform diagram 1100 illustrating multiple imbalanced first and second output signals received from a resolver sensor in accordance with embodiments of the present disclosure.

FIG. 11 is a waveform diagram 1100 illustrating multiple imbalanced first and second output signals received from a resolver sensor in accordance with embodiments of the present disclosure. The waveform diagram 1100 includes a (degraded) first (cosine) output signal 1110, a second (sine) output signal 1120, an exciter reference signal 1130, a first (e.g., longer window) voltage RMS output 1140, a second (e.g., shorter window) voltage RMS output 1142, and a fault signal 1150.

Around time 192 mS, noise and/or a winding fault (for example), causes a drop 1102 in the instantaneous peak-to-peak voltage of the first (e.g., cosine) voltage output signal 1110. The disclosed resolver 138 generates the first (e.g., longer window) voltage RMS output 1140 in response to integrating the first (e.g., cosine) voltage output signal 1110 and the second (e.g., sine) voltage output signal over a longer window (e.g., 20-times longer than the shorter window). Likewise the disclosed resolver 138 generates the second (e.g., shorter window) voltage RMS output 1142 in response to integrating the first (e.g., cosine) voltage output signal 1110 and the second (e.g., sine) voltage output signal 1120 over a shorter window (e.g., 20-times shorter than the longer window).

Accordingly, the value of the second (e.g., shorter window) voltage RMS output 1142 falls (more quickly than the RMS output 1140) in response to the drop 1102 in the peak-to-peak voltage of the first (e.g., cosine) voltage output signal 1110. The lowered value of the second (e.g., shorter window) voltage RMS output 1142 is discernable near time 192 mS, where the (e.g., power) value of the second (e.g., shorter window) voltage RMS output 1142 diverges (e.g., becomes less than) the corresponding value of the first (e.g., longer window) voltage RMS output 1140. When the (e.g., magnitude of the) difference between the first (e.g., longer window) voltage RMS output 1140 and the second (e.g., shorter window) voltage RMS output 1142 falls below the programmably selected threshold, the resolver 138 deasserts the fault signal 1150 around the time of 197 mS.

Additional imbalances are detected and handled by the disclosed resolver 138 in a similar manner (e.g., to the imbalance starting at time 155 mS). For example, a fault imbalance is detected at around times 192 mS, 204 mS, and 211 mS, where the fault signal 1150 is respectively asserted (e.g. 1104) for each such time, and the fault signal 1150 is respectively deasserted at around times 197 mS, 209 mS, and 214 mS (where the each imbalance is reduced to a level within a thresholded tolerance range).

Figure 12:
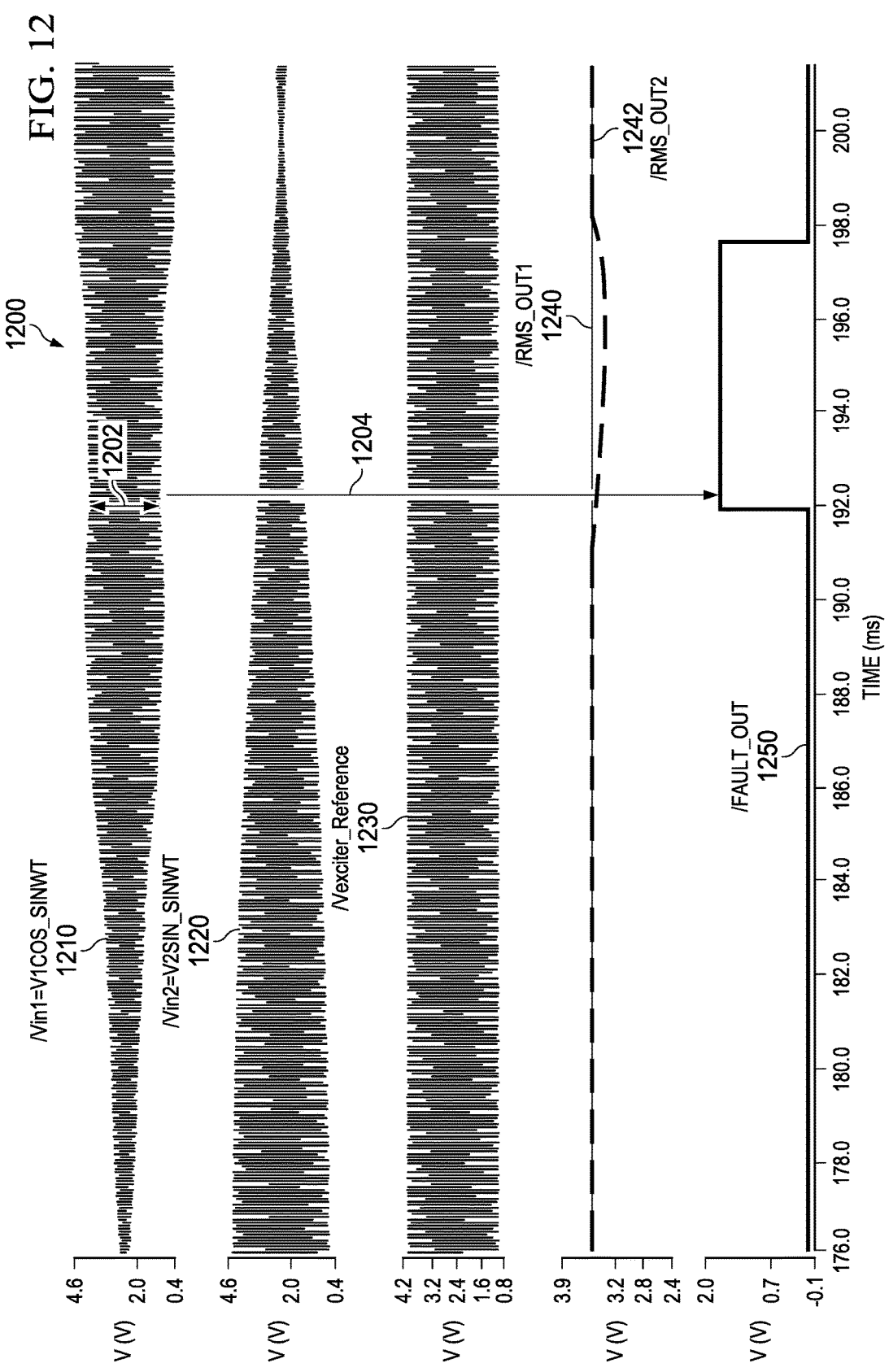
FIG. 12 is a waveform diagram 1200 illustrating fine details of imbalanced first and second output signals received from a resolver sensor in accordance with embodiments of the present disclosure.

FIG. 12 is a waveform diagram 1200 illustrating fine details of imbalanced first and second output signals received from a resolver sensor in accordance with embodiments of the present disclosure. The waveform diagram 1200 includes a (non-ideal) first (cosine) output signal 1210, a second (sine) output signal 1220, an exciter reference signal 1230, a first (e.g., longer window) voltage RMS output 1240, a second (e.g., shorter window) voltage RMS output 1242, and a fault signal 1250.

Around time 192 mS, a rotationally dependent (e.g., winding- or noise-induced fault that is functionally dependent on a shaft angle) fault causes a drop in the instantaneous peak-to-peak voltage of the first (e.g., cosine) voltage output signal 1210. The disclosed resolver 138 generates the first (e.g., longer window) voltage RMS output 1240 in response to integrating the first (e.g., cosine) voltage output signal 1210 and the second (e.g., sine) voltage output signal over a longer window (e.g., 20-times longer than the shorter window). Likewise the disclosed resolver 138 generates the second (e.g., shorter window) voltage RMS output 1242 in response to integrating the first (e.g., cosine) voltage output signal 1210 and the second (e.g., sine) voltage output signal 1220 over a shorter window (e.g., 20-times shorter than the longer window).

Accordingly, the value of the second (e.g., shorter window) voltage RMS output 1242 falls in response to the drop 1202 in the peak-to-peak voltage of the first (e.g., cosine) voltage output signal 1210. When the (e.g., magnitude of the) difference between the first (e.g., longer window) voltage RMS output 1240 and the second (e.g., shorter window) voltage RMS output 1242 exceeds a programmably selected threshold, the resolver 138 asserts (e.g., 1204) the fault signal 1250 around the time of 192 mS. When the (e.g., magnitude of the) difference between the first (e.g., longer window) voltage RMS output 1240 and the second (e.g., shorter window) voltage RMS output 1242 falls below the programmably selected threshold, the resolver 138 deasserts the fault signal 1250 around the time of 197 mS.

Figure 13:
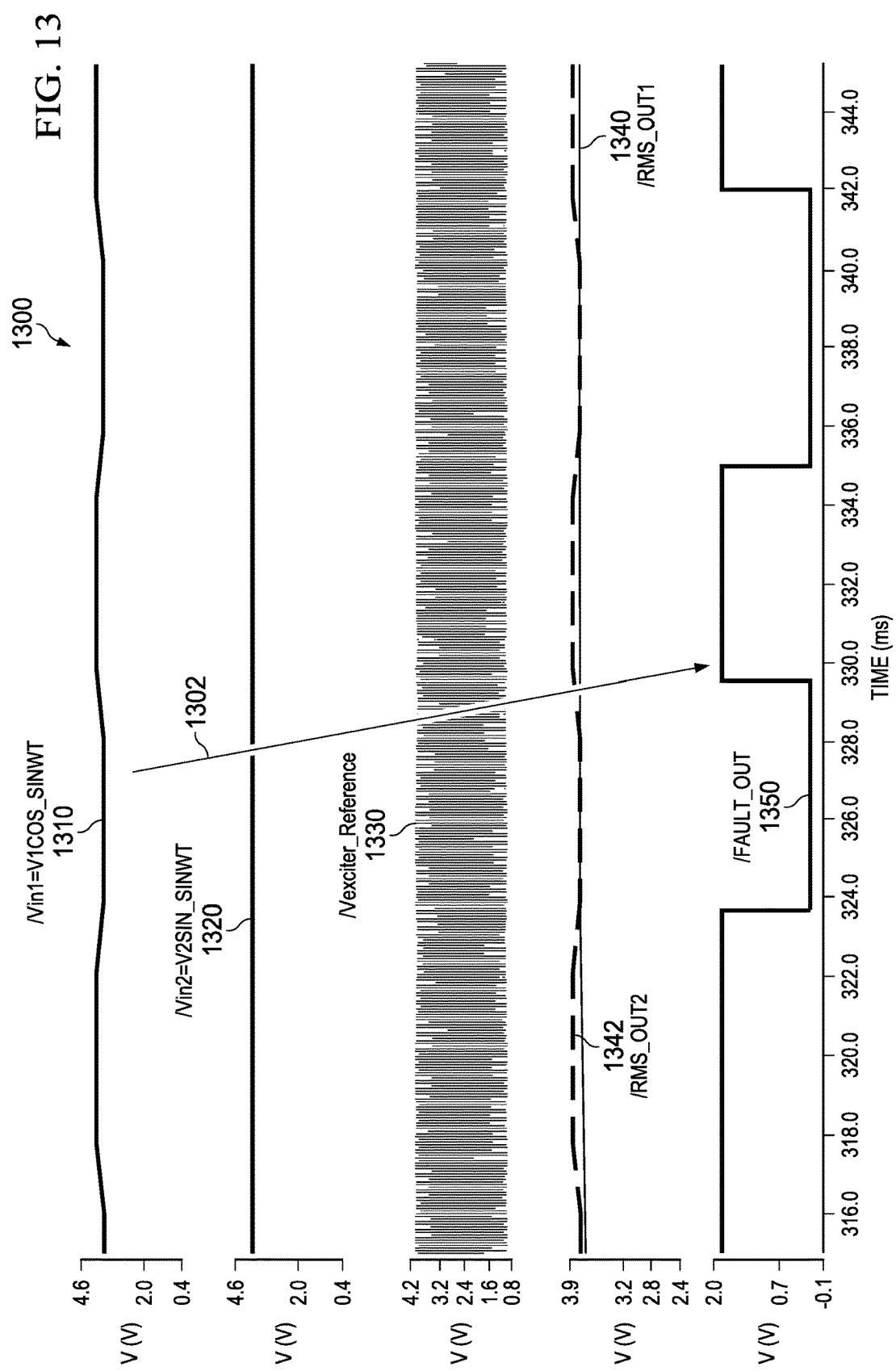
FIG. 13 is a waveform diagram 1300 illustrating imbalanced first and second output signals received from a resolver sensor of a static motor in accordance with embodiments of the present disclosure.

FIG. 13 is a waveform diagram 1300 illustrating imbalanced first and second output signals received from a resolver sensor of a static motor in accordance with embodiments of the present disclosure. The waveform diagram 1300 includes a (e.g., degraded) first (cosine) output signal 1310, a second (sine) output signal 1320, an exciter reference signal 1330, a first (e.g., longer window) voltage RMS output 1340, a second (e.g., shorter window) voltage RMS output 1342, and a fault signal 1350.

Around time 329 mS, a non-rotationally dependent (e.g., winding- or noise-induced fault that occurs for example when shaft angle is static) fault causes a rise in the voltage of the first (e.g., "cosine") voltage output signal 1310. Accordingly, the value of the second (e.g., shorter window) voltage RMS output 1342 rises in response to the rise in the voltage of the first (e.g., "cosine") voltage output signal 1310. When the (e.g., magnitude of the) difference between the first (e.g., longer window) voltage RMS output 1340 and the second (e.g., shorter window) voltage RMS output 1342 exceeds a programmably selected threshold, the resolver 138 asserts (e.g., 1302) the fault signal 1350 around the time of 330 mS. When the (e.g., magnitude of the) difference between the first (e.g., longer window) voltage RMS output 1340 and the second (e.g., shorter window) voltage RMS output 1342 falls below the programmably selected threshold, the resolver 138 deasserts the fault signal 1350 around the time of 335 mS.

Figure 14:
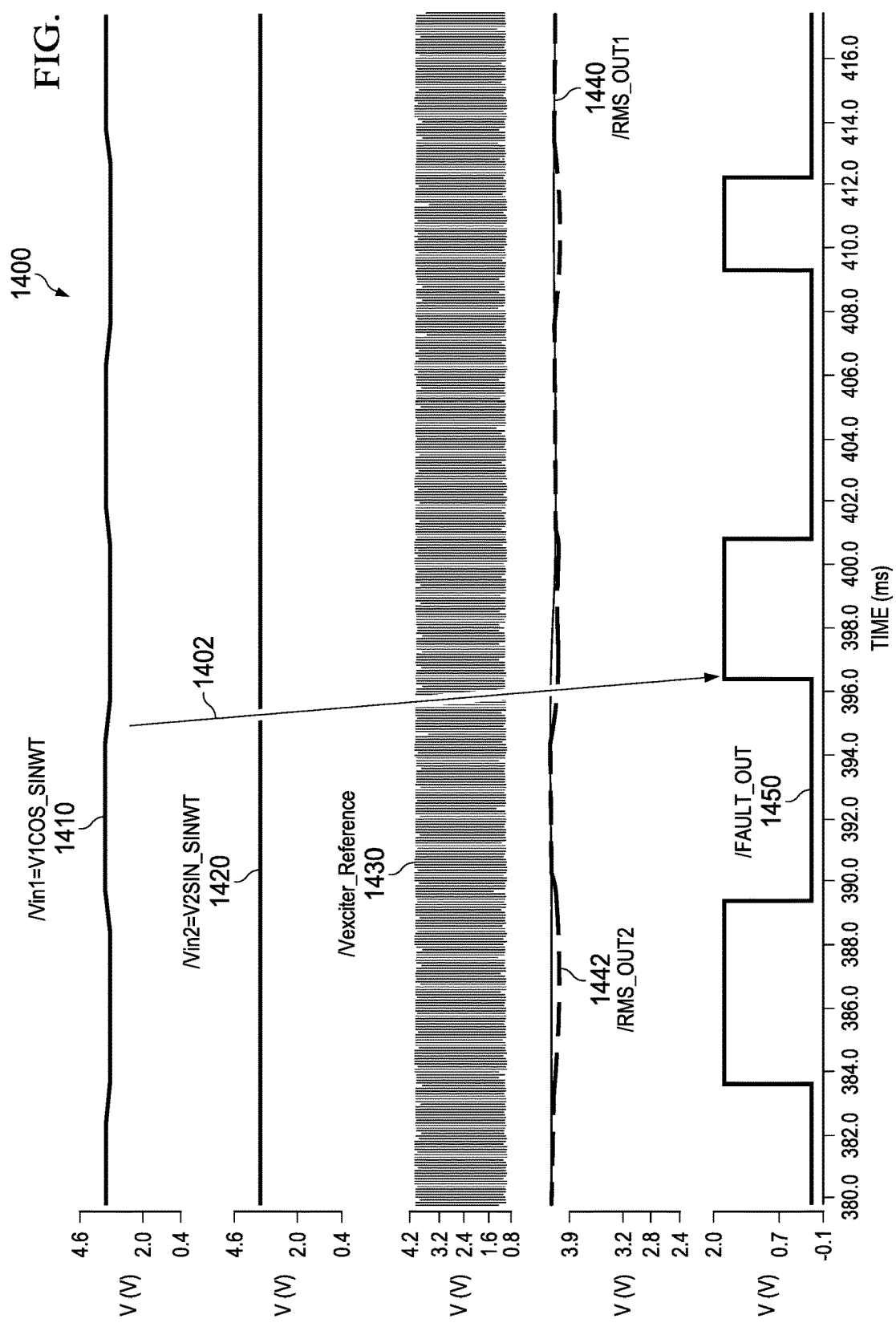
FIG. 14 is a waveform diagram 1400 illustrating subsequent imbalanced first and second output signals received from a resolver sensor of a static motor in accordance with embodiments of the present disclosure.

FIG. 14 is a waveform diagram 1400 illustrating subsequent imbalanced first and second output signals received from a resolver sensor of a static motor in accordance with embodiments of the present disclosure. The waveform diagram 1400 includes a (degraded) first (cosine) output signal 1410, a second (sine) output signal 1420, an exciter reference signal 1430, a first (e.g., longer window) voltage RMS output 1440, a second (e.g., shorter window) voltage RMS output 1442, and a fault signal 1450.

Around time 396 mS, a non-rotationally dependent (e.g., winding- or noise-induced fault that occurs for example when shaft angle is static) fault causes a rise in the voltage of the first (e.g., "cosine") voltage output signal 1410. Accordingly, the value of the second (e.g., shorter window) voltage RMS output 1442 rises in response to the rise in the voltage of the first (e.g., cosine) voltage output signal 1410. When the (e.g., magnitude of the) difference between the first (e.g., longer window) voltage RMS output 1440 and the second (e.g., shorter window) voltage RMS output 1442 exceeds a programmably selected threshold, the resolver 138 asserts (e.g., 1402) the fault signal 1450 around the time of 396 mS. When the (e.g., magnitude of the) difference between the first (e.g., longer window) voltage RMS output 1440 and the second (e.g., shorter window) voltage RMS output 1442 falls below the programmably selected threshold, the resolver 148 deasserts the fault signal 1450 around the time of 401 mS.

Figure 15:
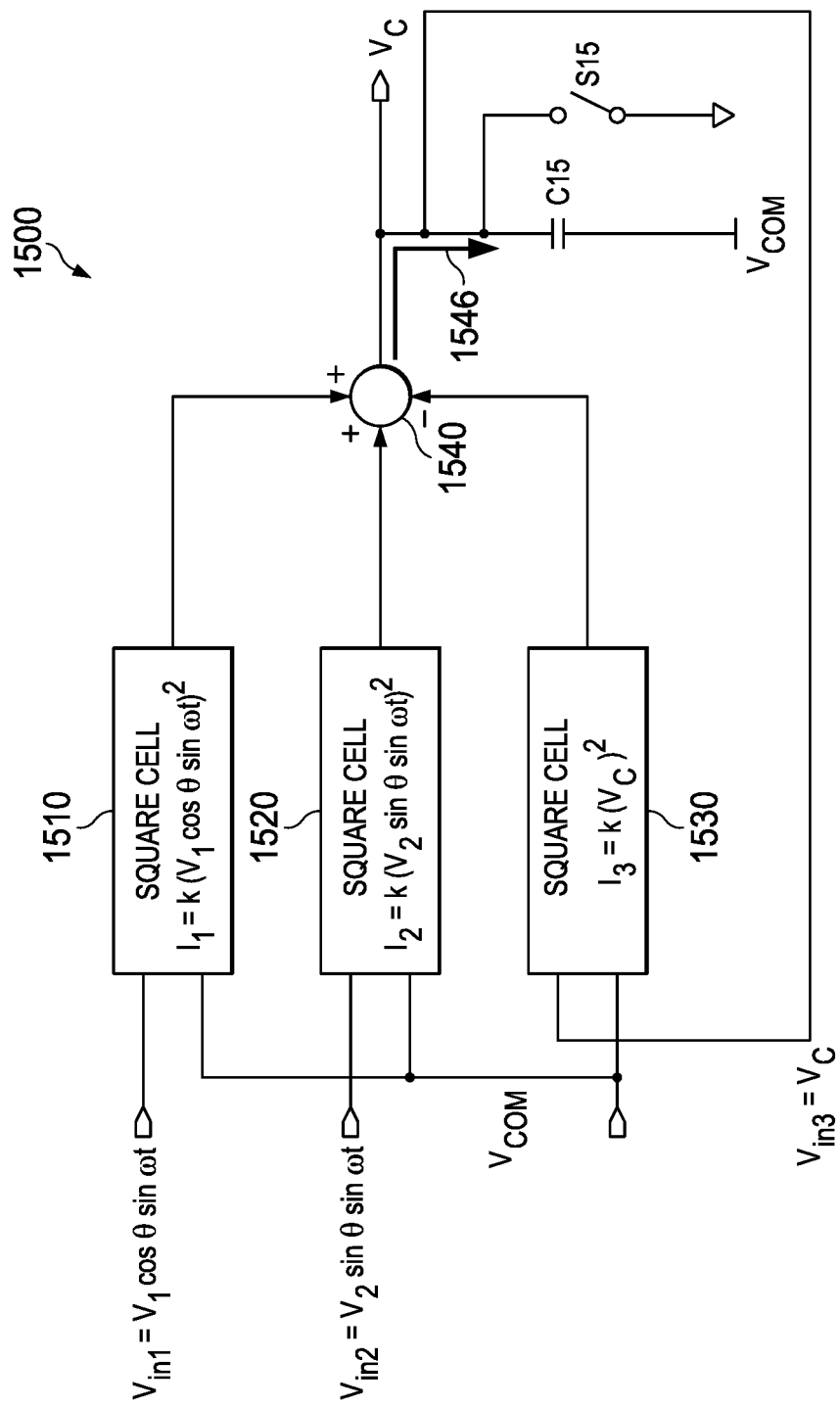
FIG. 15 is a schematic diagram illustrating a resolver sensor output signal power averaging circuit 1500 in accordance with embodiments of the present disclosure.

FIG. 15 is a schematic diagram illustrating a resolver sensor output signal power averaging circuit 1500 in accordance with embodiments of the present disclosure. The resolver sensor output signal power averaging circuit 1500 includes "square" (e.g., as in performing the mathematic exponential squaring function) cells 1510, 1520, and 1530, current summer 1540, and integrator (e.g., capacitor) C15. Generally, the resolver signal output signal power averaging circuit 1500 is arranged to generate an average power signal for indicating an average value of the resolver sensor output signal power, where the average is determined in response to a time window determined in response to the value of C15. The resolver sensor output signals are signals such as the first (e.g., cosine) output signal $V_{in1}$ and the second (e.g., sine) output signal $V_{in2}$.

The square cell 1510 is arranged to square an average of the first (e.g., cosine) output signal $V_{in1}$, with respect to common mode signal $V_{COM}$ such that a first current is generated for representing the first squared average (power). The square cell 1520 is arranged to square an average of the second (e.g., sine) output signal $V_{in2}$, with respect to common mode signal $V_{COM}$ such that a second current is generated for representing the second squared average (power). The square cell 1530 is arranged to square the average of average power signal Vc and the common mode signal $V_{COM}$ such that a third current is generated for representing the third squared average (power).

Each of the generated (e.g., first, second, and third) currents is summed (e.g., added or subtracted) by current summer 1540 to produce a summed current 1546, which generates the average power signal $V_C$ in accordance with the voltage developed by an averaging capacitor C (e.g., integrator C15). Accordingly, the average power signal $V_C$ establishes (e.g., is a portion of) a feedback loop, where current added by the square cells 1510 and 1520 is offset (e.g., in a stable and locked steady state operation condition) by the current subtracted by the square cell 1530. The charging or discharging process of the averaging capacitor C can be described by the following equation:

$$V_{C(t)} = V_{C(t_0)} + \frac{1}{C}\int_{t_0}^{t}(i_{V_1\cos\theta\sin\omega t} + i_{V_2\sin\theta\sin\omega t} - I_{Vc})dt \quad (8)$$

$$= V_{C(t_0)} + \frac{k}{C}\int_{t_0}^{t_0+T}[(V_1\cos\theta\sin\omega t)^2 + (V_2\sin\theta\sin\omega t)^2 - V_{C(t)}^2]dt \quad (9)$$

where k is a constant and t is a particular time between to (an initial time) and T (elapsed time after $t_0$).

After the feedback loop achieves a steady state operating condition, where the average power signal $V_C$ is substantially constant (e.g., direct current), the integration term of equation (9) is set equal to zero. The integration term of equation (9) is set equal to zero because during the steady state operating condition (for example), Vc stops charging or discharging (steady state condition) and the sum of first two square cell currents is equal and opposite to the third cell current:

$$\int_{t_0}^{t_0+T}[(V_1\cos\theta\sin\omega t)^2 + (V_2\sin\theta\sin\omega t)^2 - V_{C(t)}^2]dt = 0 \quad (10)$$

Accordingly, $$V_{C(t)}^2 T = \int_{t_0}^{t_0+T} [(V_1 \cos\theta \sin\omega t)^2 + (V_2 \sin\theta \sin\omega t)^2] dt$$

$$V_{C(t)} = \sqrt{\frac{1}{T}\int_{t_0}^{t_0+T} [(V_1 \cos\theta \sin\omega t)^2 + (V_2 \sin\theta \sin\omega t)^2] dt}$$

$$= \sqrt{\frac{1}{T}\int_{t_0}^{t_0+T} V^2(\cos^2\theta + \sin^2\theta)\sin^2\omega t\, dt} \quad (11)$$

$$= \sqrt{\frac{1}{T}\int_{t_0}^{t_0+T} V^2 \sin^2\omega t\, dt} \quad (12)$$

$$= \sqrt{\frac{V^2}{T}\int_{t_0}^{t_0+T} \frac{1-\cos2\omega t}{2} dt}$$

$$= \sqrt{\frac{V^2}{T} \times \frac{T}{2}} = \frac{V}{\sqrt{2}} = V_{RMS} \quad (13)$$

where equation (12) is derived from equation (11) in accordance with the trigonometric identity $\cos^2\theta + \sin^2\theta = 1$, such that the sine/cosine effect of the first (e.g., cosine) and second (e.g., sine) output signals is decoupled from the power term $V_{RMS}$ of equation (13).

Accordingly, the voltage Vc(t) developed by the charge stored on the averaging capacitor C is an RMS measure of total power of modulated signals $V_{in1} = V_1 \cos(\theta)\sin(\omega t)$ and $V_{in2} = V_2 \sin(\theta)\sin(\omega t)$. As noted above, the $\sin(\omega t)$ effect is decoupled by the squared-sum calculation (such that, as disclosed herein, errors can be detected in the $V_{in1}$ and $V_{in2}$ signals independently of a reference to oscillations of an excitation signal). Additionally, the power term $V_{RMS}$ of equation (13) is independent of the coefficient k/C in above equation (9). However, it is disclosed herein the coefficient k/C determines the time window (e.g., settling time) over which the power term $V_{RMS}$ is determined. Accordingly, two separate (e.g., with some optionally shared components) resolver sensor output signal power averaging circuits 1500 each including different-valued integrators C15 are disclosed for producing average power calculations using shorter and longer time windows (as discussed with reference to FIG. 16 below).

In above equations (8) through (13), the RMS measurement is obtained by assuming V1=V2=V. When one or both of $V_{in1}$ and $V_{in2}$ signals are degraded by any of offset drift, distortion, winding faults, "glitches," and coupled noise, the $V_{RMS}$ is affected (e.g., changed), and such changes in $V_{RMS}$ that exceed a selected threshold can be detected by the resolver output signal power imbalance detector discussed below with reference to FIG. 16.

In an alternate embodiment, the square cell 1530 can be omitted and can be replaced by an optional switch S15. The switch S15 is arranged to selectively set (e.g., during a steady-state operating condition) the integrator C15 to a known voltage (e.g., in response to a signal "discharge" asserted by a processor controlling programmable components of the resolver sensor output signal power averaging circuit 1500). Because the sum of the square of Vin1 and Vin2 currents is used to determine an RMS power (for example), and is averaged over a period determined over an integrating capacitor, a mere summing of the two currents tends to eventually saturate the averaging capacitor C15. To avoid such saturation of the averaging capacitor C15, a square cell such as 1530 can be arranged to subtract current at a summing node, and/or current can be subtracted by selectively using a switch S15 to discharge the averaging capacitor C15. The voltage developed at the high side of the averaging capacitor C15 is accordingly controlled such that the developed voltage is normally within the operational voltage range of the comparators 1662 and 1664 discussed below.

As disclosed herein, average power signal are generated for detecting a power imbalance between the first and second resolver sensor output signals. The first and second resolver sensor output signals are typically generated by a resolver sensor in response to inductively coupling an exciter reference signal such that the first resolver sensor signal is associated with first physical orientation that is different from a second physical orientation associated with the second resolver sensor signal.

When a power imbalance (e.g., which can be caused by a fault-causing transient condition such as electrical noise or a winding defect) exists between the first and second resolver sensor output signals, the power imbalance is detected and a fault signal is generated. The fault signal is used to "warn" control circuitry, for example, that positioning (and/or rotational speed) information derived from the first and second resolver sensor output signals is degraded such that protective measures can be taken (including blocking actions by the control circuitry that might otherwise be taken).

Figure 16:
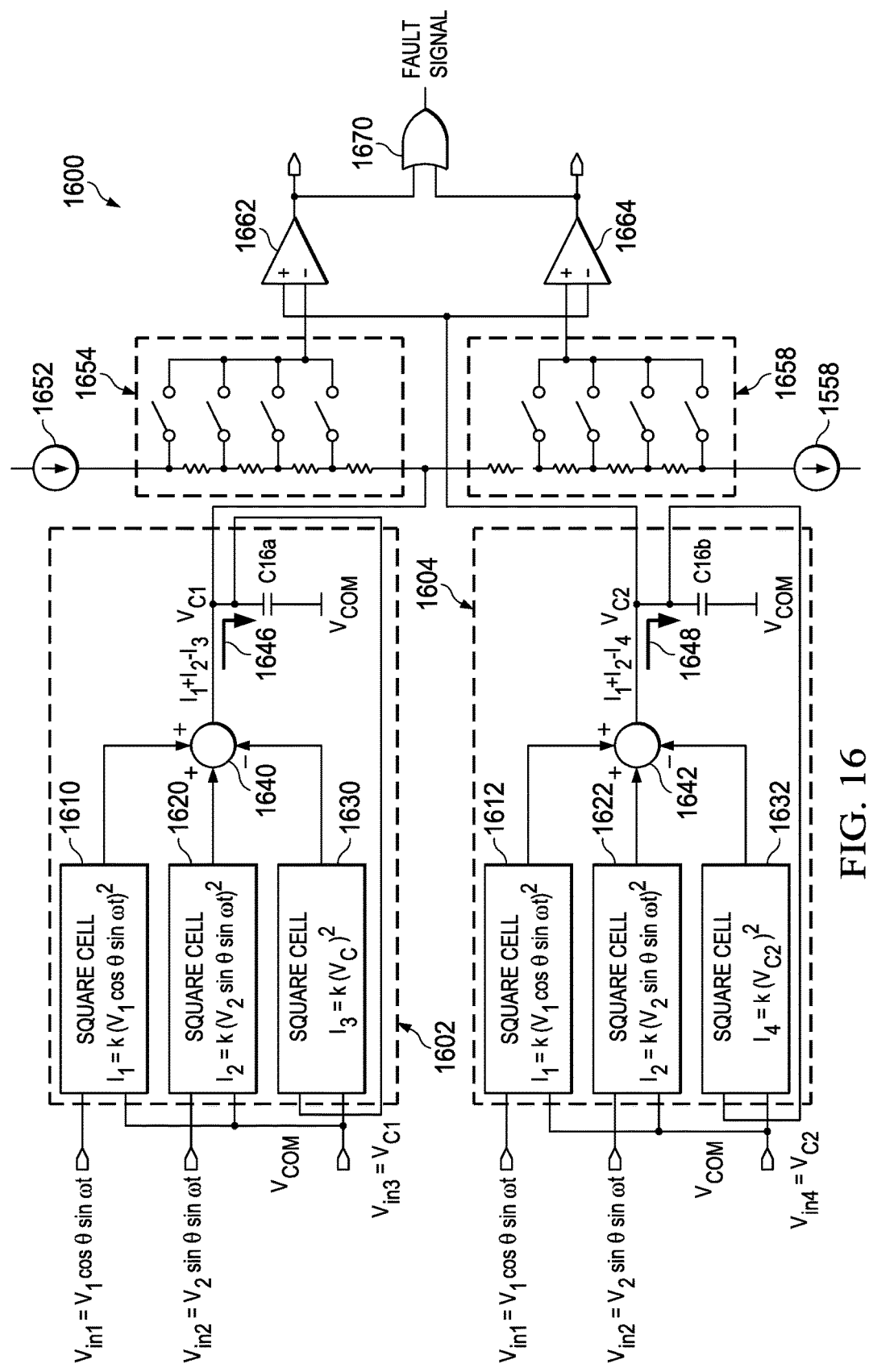
FIG. 16 is a schematic diagram illustrating a resolver sensor output signal power imbalance detector 1600 in accordance with embodiments of the present disclosure.

FIG. 16 is a schematic diagram illustrating a resolver sensor output signal power imbalance detector 1600 in accordance with embodiments of the present disclosure. The resolver sensor output signal power imbalance detector 1600 includes resolver output signal power averaging circuits 1602 and 1604, programmable voltage dividers 1654 and 1658, current sources 1652 and 1558, comparators 1662 and 1664, and fault signal generator 1670.

Generally, the resolver output signal power averaging circuits 1602 and 1604 are arranged to each generate an average power signal in response to first and second resolver sensor output signals. Each of the generated average power signals is averaged using a different time period (e.g., window) such that (for example, the start of) a transient (e.g., due to noise or a winding defect) signal imposed on one of the first and second resolver sensor output signals affects the generated average power signals unevenly. The imbalanced first and second resolver sensor output signals affect the generated average power signals unevenly because of the different integration rates and/or different time windows of the resolver output signal power averaging circuits 1602 and 1604.

The duration of the first and second time windows are selected to have a duration such that that an imbalance caused by a transient event is detectable by comparing a first average power signal with a second average power signal. The first average power signal is generated by the resolver output signal power averaging circuit 1602 and the second average power signal is generated by the resolver output signal power averaging circuit 1604. Accordingly, comparing the (e.g., differently affected) average power signals determines (e.g., within selected thresholds) an error condition caused by the power imbalance and a fault signal is generated in response for indication the error condition.

When the comparators 1662 and 1664, the programmable voltage dividers 1654 and 1658, and the (relatively very small) OR-gate (e.g., fault signal generator 1670) are also considered to be (or implemented using) analog devices, the resolver sensor output signal power imbalance detector 1600 operates virtually completely in an analog domain. Substantially operating in the analog domain obviates, for example, costs associated with conventional digital solutions and digital signal processing. The disclosed resolver sensor output signal power imbalance detector 1600 can be laid out relatively compactly. For example, the square cell 1700 (which is representative of portions of square cells such as 1610, 1620, 1630, 1612, 1622, and 1632) is discussed below with reference to FIG. 17 (e.g., in view of FIG. 16). The square cell 1700 includes analog components, which can be laid out compactly and also closely replicated such that each such replicated square cell performs substantially similarly with respect to PVT (process, voltage, and temperature) variations.

The resolver output signal (longer term) power averaging circuit 1602 includes the square cells 1610, 1620, and 1630, current summer 1640, and integrator (e.g., capacitor) C16*a*. The first square cell 1610 is a circuit for generating a resolver sensor first output power signal (e.g., for indicating the power of the resolver sensor first output signal). The second square cell 1620 is a circuit for generating a resolver sensor second output power signal (e.g., for indicating the power of the resolver sensor second output signal). The third square cell 1630 is an optional circuit for a third square circuit for generating a first (e.g., longer term) average value of the resolver sensor output signal power and coupling the resolver sensor first output power signal to the current summer 1640. The current summer 1640 is a circuit for summing the resolver sensor first and second output power signals (and the squared resolver sensor first output power signal, if present) and coupling the summation 1646 to the integrator C16*a*. Generally, the resolver output signal power averaging circuit 1602 is arranged to generate a first average power signal for indicating an average value of the resolver output signal power, where the average is determined in response to a first time window determined in response to the value of integrator C16*a*.

The resolver output signal (shorter-term) power averaging circuit 1604 includes the square cells 1612, 1622, and 1632, current summer 1642, and integrator (e.g., capacitor) C16*b*. The first square cell 1612 is a circuit for generating a resolver sensor first output power signal (e.g., for indicating the power of the resolver sensor first output signal). The second square cell 1622 is a circuit for generating a resolver sensor second output power signal (e.g., for indicating the power of the resolver sensor second output signal). The third square cell 1632 is an optional circuit for a third square circuit for generating a second (e.g., near instantaneous-term) average value of the resolver sensor output signal power and coupling the second average value of resolver output signal power to the current summer 1642. The current summer 1642 is a circuit for summing the resolver sensor first and second output power signals and coupling the summation 1648 to the integrator C16*b*. Generally, the resolver output signal power averaging circuit 1604 is arranged to generate a second average power signal for indicating a second average value of the resolver output signal power, wherein the second average value is determined in response to a second time window determined in response to the value of a second integrator. The second time window is selected to be shorter than the first time window such that the time window (e.g., having a time period determined by an integration rate of a respective integrator C16) is different between the resolver output signal power averaging circuit 1602 and the resolver output signal power averaging circuit 1604.

Square cell 1610 is coupled to the same input signals as square cell 1612, and the square cell 1620 is coupled to the same input signals as square cell 1622. In a shared square cell embodiment, components of square cells having the same inputs can be shared (and, for example, current mirrors applied to the outputs such that the output currents can be summed by separate summers (e.g., 1640 and 1642). Square cells 1630 and 1632 do not share common inputs (as discussed below) and are typically laid out as separate square cells (when present).

Accordingly, the resolver sensor output signal power imbalance detector 1600 can be laid out with only four square cells. For example, a first square cell of the resolver output signal power averaging circuit 1602 and a first square cell of the resolver output signal power averaging circuit 1604 share a reference current mirror for generating separate output signals in response to a first set of common inputs (e.g., a first resolver sensor output signal and a feedback signal). Likewise, a second square cell of the resolver output signal power averaging circuit 1602 and a second square cell of the resolver output signal power averaging circuit 1604 share a reference current mirror for generating separate output signals in response to a second set of common inputs.

The operation of the resolver output signal power averaging circuits 1602 and 1604 is generally similar to the operation of resolver output signal power averaging circuits 1500 discussed above. However, the averaging capacitor C16*a* (of signal power averaging circuit 1602) is a different value than the averaging capacitor C16*b* (of signal power averaging circuit 1604). The difference in size between capacitors C16*a* and C16*b* causes voltages to be developed at different rates for nodes $V_{C1}$ and $V_{C2}$, such that different currents are developed by the square cells 1630 and 1632 (as discussed above with respect to FIG. 15). Accordingly, the amount of current supplied by square cell 1630 to the current summer 1640 is different from the amount of current supplied by square cell 1632 to the current summer 1642.

For example, where the capacitance of C16*a* is much larger than the capacitance of C16*b* (e.g., 20 times larger), the averaging time (e.g., RMS measurement window) of node VC1 is proportionately larger than the averaging time of nodes VC2. Accordingly, the voltage of node VC2 is associated with input signal power measured over a shorter-term (e.g., relatively instantaneous) RMS measurement window, is associated with input signal power measured over a longer-term RMS measurement window. Typically, the shorter-term RMS measurement window is selected to be short enough such that a phase imbalance can be detected within a relatively short period of time (e.g., within a period less than around two or more oscillations and/or within a period less than around one-half of the longer-term RMS measurement window). The shorter-term RMS measurement window is selected to be (e.g., slightly) than a selected EMI/noise time period such that the shorter window excludes disturbances in the measured power caused by EMI, noise, winding faults, and the like (e.g., collectively, "noise"). Accordingly, the length of the shorter-term RMS measurement window is determined in response to a selected noise time period. The selected noise time period can be selected, for example, by empirically measuring and/or observing noise in one or more systems and selecting a value by which many (if not most or all) events causing noise are not detected by the shorter window (and still remain detectable using the longer-term RMS measurement window).

When one the input signals is suddenly corrupted, the nearly instantaneous power RMS value $V_{C2}$ responds more quickly than does longer-term average counterpart $V_{C1}$, such that a fault is triggered when the difference exceeds a selected (e.g., programmable) voltage threshold. The selected voltage threshold is selected (e.g., programmed) to level in accordance with closing (e.g., actuated under software control of a processor controlling programmable components of the resolver sensor output signal power imbalance detector 1600) selected switches in first and second programmable voltage dividers (1654 and 1658), in accordance with the amount of currents sourced and sunk by (e.g., bandgap circuit) current sources, and in accordance with resistor network theory.

For example, each of the individual resistors in the programmable voltage dividers 1654 and 1658 are selected (e.g., at design time) to provide programmable levels to provide different sensitivity levels (e.g., after deployment) for different (and, e.g., expected) motor applications. The programmable levels can be selected in accordance with Ib*R*N, where Ib is a current generated responsive to a bandgap reference and R is a resistance selected in accordance with selected switching configuration N and the values of the resistors selected by the selected switching configuration. The value N can be a hexadecimal value, where each bit selects the state of a switch for selectively coupling an individual resistor to a selected resistor network configuration.

The fault signal generator 1670 is arranged to toggle (e.g., assert and deassert) the fault signal output in response to the thresholding and comparisons of comparators 1662 and 1664 (collectively, "comparator circuit"). The comparator circuit is arranged to compare the first average power signal and the second average power signal and to generate (via fault signal generator 1670) a fault signal when the first average power signal and the second average power signal differ by the threshold voltage.

For example, the comparator 1662 toggles high (e.g., is set to logic one) when the instantaneous (e.g., shorter-term) average power is greater than the longer-term power average power by the programmed voltage threshold. Also, for example, the comparator 1664 toggles high (e.g., is set to logic one) when the instantaneous (e.g., shorter-term) average power is less than the longer-term power average power by the programmed voltage threshold. The fault signal generator 1670 is arranged to assert the fault signal output when either of the comparators 1662 and 1664 is toggled high, and to deassert the fault signal output when both of the comparators 1662 and 1664 are toggled low.

In another embodiment, the voltage threshold can be embodied as an (e.g., hysteretic) offset within a comparator such that (e.g., a portion of) the threshold is fixed and "designed-in" to the comparator. Accordingly, the programmable voltage dividers 1654 and 1658 can be omitted or combined with a comparator circuit having a designed-in offset for a voltage threshold.

Figure 17:
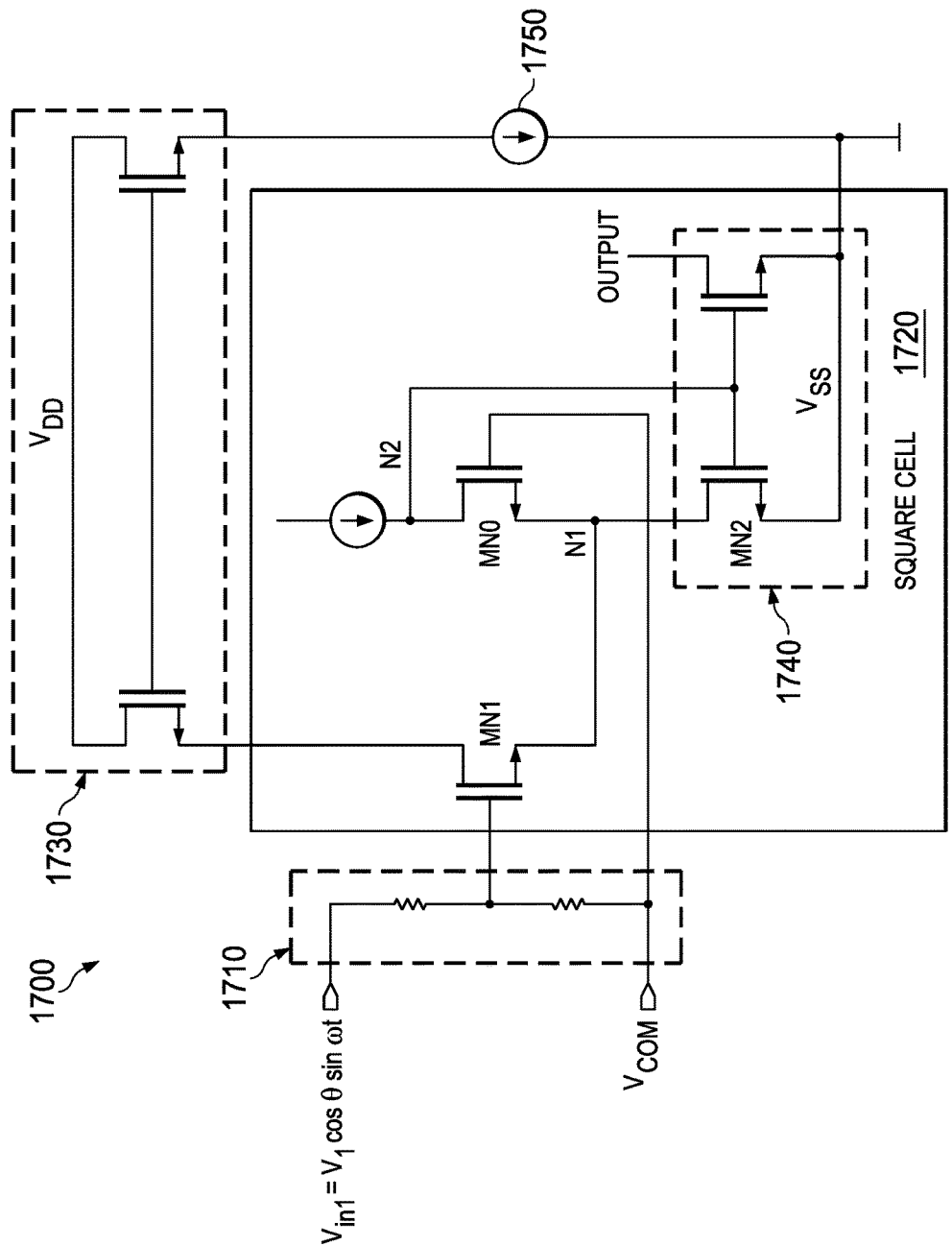
FIG. 17 is a schematic diagram of a square cell.

FIG. 17 is a schematic diagram of a square cell. The square cell 1700 is a square cell such as described in U.S. Pat. No. 7,791,400. The square cell 1700 includes a voltage divider 1710, and amplifier 1720, a "head" current mirror 1730, and a "tail" current mirror 1740.

In operation, the voltage divider 1710 is arranged to scale an input voltage (e.g., $V_{in1}$) to a voltage suitable for biasing the input transistor MN1 of the amplifier 1720. The amplifier 1720 is arranged to output a current having a magnitude in accordance with a square of a scaled input voltage. For example, the transistor MN1 performs the square calculation, where any current injection from MN1 to node N1 raises the voltage of node N1 such that the voltage rise in N1 is amplified by transistor MN0 at node N2, which in turn raises the gate voltage of transistor MN2 (of tail current mirror 1740) such that the transistor MN2 is arranged to sink the current injected into node N1. The "tail" current mirror 1740 can be arranged with additional mirrored output transistors, such that multiple duplicate outputs of the "squared" current are provided (e.g., where each mirrored output is for separately controlling the charging and discharging of one of the averaging capacitors C16a and C16b described above with reference to FIG. 16).

In various embodiments, more than two modulated signals received from the resolver sensor 140 can be monitored for imbalance detection in accordance with the teachings herein. For example, various geometric (and trigonometric) principles are used to decouple modulated signals (e.g., received from the resolver sensor 140) having phase angle offsets other than 90 degrees. Accordingly, for any N-poly phase cases, where N=2, 3, 4 . . . , and where the phase lags are equally (e.g., by 120°) and/or uniformly (e.g., by 60°) distributed among signals, the θ effect (e.g., sinusoidal exciter reference stimulus) can be cancelled in accordance with the squared sum operation.

In a three-phase resolver embodiment, a three-phase resolver is arranged to operate in accordance with three electrical phases, each having a phase offset of 120 degrees from an adjacent coil. The three-phase resolver secondary coils generate an electromagnetic field in response to an exciter reference signal. Three stator coils are positioned, (e.g., 120 degrees apart from an adjacent coil with respect to a longitudinal axis of the shaft. Each of the resolver output signals is related in accordance with v1=V1*sin(θ), v2=V2*sin(θ+120°), and v3=V3*sin(θ+240°).

Accordingly, $$V_{C(t)} = \frac{1}{C}\int_{t_0}^{t}(I_1+I_2+I_3)dt = \frac{1}{C}\int_{t_0}^{t}[V_1^2\sin^2\theta + \quad\quad (14)$$

$$V_2^2\sin^2(\theta+120°) + V_3^2\sin^2(\theta+240°)^2]dt$$

$$= \frac{V^2}{C}\int_{t_0}^{t}[\sin^2\theta + (\sin\theta\cos 120° + \cos\theta\sin 120°)^2 +$$

$$(\sin\theta\cos 240° + \cos\theta\sin 240°)^2]dt$$

$$= \frac{V^2}{C}\int_{t_0}^{t}\left[\sin^2\theta + \left(\sin\theta\cdot\left(-\frac{1}{2}\right) + \cos\theta\cdot\frac{\sqrt{3}}{2}\right)^2 + \right.$$

$$\left.\left(\sin\theta\cdot\left(-\frac{1}{2}\right) + \cos\theta\cdot\left(\frac{\sqrt{3}}{2}\right)\right)^2\right]dt$$

$$= \frac{V^2}{C}\int_{t_0}^{t}\left[\frac{6}{4}\sin^2\theta + \frac{6}{4}\cos^2\theta\right]dt$$

$$= \frac{3V^2}{2C}\int_{t_0}^{t}[\sin^2\theta + \cos^2\theta]dt = \frac{3V^2}{2C}(t-t_0)$$

$$= \frac{3V^2 T}{2C}$$

As seen in equation (14), the sine effect of the first, second, and third resolver output signals is decoupled from the power term. The energy indicated by equation (14) is 50 percent more than the power term $V_{RMS}$ of equation (13). In the three-phase resolver embodiment, an additional square cell is instantiated (not shown in the Figure). Accordingly, three square cells for each of V1, V2 and, V3 are provided and two Vc1 and Vc2 square cells are provided as described earlier. However, the additional power is (normally) applied to both a first (longer-term) power averaging circuit and a second (shorter-term) power averaging circuit such that the $V_{C(t)}$ terms are integrated at different rates (e.g., using different time windows). Because the fault signal is generated on the basis of the comparison, no fault is detected in a balanced condition because the additional power is applied equally to both power averaging circuits.

In an embodiment where the first, second, and third resolver output signals are 60 degrees apart (rather than 120 degrees as discussed above), the combined power output is also in accordance with equation (14) in part due to trigonometric identities. Accordingly, the exciter signal sine function can be decoupled from a power output signal using any suitable trigonometric functions (where the decoupled power output signal can be used in an analog domain to determine an imbalance in the output signals of an angular resolver).

In a three-phase resolver embodiment, each of the stator coils output an (e.g., differential) resolver output signal. Each of the three resolver output signals is coupled to a first (longer-term) power averaging circuit such that a current representing the square of the voltage is generated. Likewise each of the three resolver output signals is coupled to a second (shorter-term) power averaging circuit such that a current representing the square of the voltage is generated (as disclosed above, current mirrors can be used where different outputs are generated from a same set of inputs). A comparator circuit is arranged to compare the first average power signal and the second average power signal and generates a fault signal when the first average power signal and the second average power signal differ by a voltage threshold.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A detection circuit, comprising:
   (a) a first averaging circuit having first sensor inputs and a first average output, the first averaging circuit including a first capacitor coupled to the first average output and having a first capacitance;
   (b) a second averaging circuit having second sensor inputs coupled to the first sensor inputs and having a second average output, the second averaging circuit including a second capacitor coupled to the second average output and having a second capacitance different than the first capacitance; and
   (c) a comparator circuit having a first input coupled to the first average output, a second input coupled to the second average output, and having a fault signal output, the comparator circuit including:
      (i) a threshold circuit having an input coupled to the average output, a first threshold output, and a second threshold output;
      (ii) a first comparator having an input coupled to the first threshold output, having another input coupled to the first average output, and having a first comparator output;
      (iii) a second comparator having an input coupled to the second threshold output, having another input coupled to the second average output, and having a second comparator output; and
      (iv) a logic gate having an input coupled to the first comparator output, having another input coupled to the second comparator output, and having the fault signal output.

2. The detection circuit of claim 1 in which the threshold circuit includes a programmable voltage divider having an input coupled to the first average output, the first threshold output, and the second threshold output.

3. The detection circuit of claim 1 in which:
   (a) the first averaging circuit includes:
      (i) a first square circuit having an input coupled to one of the first sensor inputs, and a first square output;
      (ii) a second square circuit having another input coupled to another one of the first sensor inputs and a second square output; and
      (iii) a first summing circuit having inputs coupled to the first square output and to the second square output, and having an output coupled to the first capacitor; and
   (b) the second averaging circuit including:
      (i) a third square circuit having an input coupled to one of the second sensor inputs, and a third square output;
      (ii) a fourth square circuit having another input coupled to another one of the second sensor inputs and a fourth square output; and
      (iii) a second summing circuit having inputs coupled to the third square output and to the fourth square output, and having an output coupled to the second capacitor.

4. The detection circuit of claim 3 in which the first averaging circuit includes a fifth square circuit having an input coupled to the first capacitor and an output coupled to an input of the first summing circuit.

5. The detection circuit of claim 4 in which the second averaging circuit includes a sixth square circuit having an input coupled to the second capacitor and an output coupled to an input of the second summing circuit.

6. The detection circuit of claim 1 in which the first averaging circuit, the second averaging circuit, and the comparing circuit are analog circuits.

7. A detection circuit, comprising:
   (a) a sensor adapted to be coupled to a rotatable shaft and providing first and second sensor outputs;
   (b) a first averaging circuit having first sensor inputs coupled to the first and second sensor outputs and having a first average output, the first averaging circuit including:
      (i) first and second squaring circuits coupled to the first sensor inputs and having respective first and second squaring outputs;
      (ii) a first summing circuit having inputs coupled to the first and second squaring outputs and having a first summing output; and
      (iii) a first capacitor, having a first capacitance, coupled to the first summing output and to the first average output;
   (b) a second averaging circuit having second sensor inputs coupled to the first and second sensor outputs and having a second average output, the second averaging circuit including:
      (i) third and fourth squaring circuits coupled to the second sensor inputs and having respective third and fourth squaring outputs;
      (ii) a second summing circuit having inputs coupled to the third and fourth squaring outputs and having a second summing output; and
      (iii) a second capacitor, having a second capacitance different than the first capacitance, coupled to the second summing output and to the second average output; and (c) a comparator circuit having inputs coupled to the first summing circuit output, to the second summing circuit output, and to a threshold input and having a fault output.

8. The detection circuit of claim 7 in which the comparator circuit includes:
   (a) a threshold circuit having an input coupled to the first summing circuit output, a first threshold output, and a second threshold output;
   (b) a first comparator having one input coupled to the first threshold output, another input coupled to the second average output, and a first comparator output;
   (c) a second comparator having one input coupled to the second threshold output, another input coupled to the second average output, and a second comparator output; and
   (d) a logic gate having an input coupled to the first comparator output, another input coupled to the second comparator output, and an output coupled to the fault output.

9. The detection circuit of claim 8 in which the threshold circuit includes:
   (a) a first set of resistors and switches coupled to the first summing circuit output and having the first threshold output;
   (b) a second set of resistors and switches coupled to the first summing circuit output and having the second threshold output.

10. The detection circuit of claim 9 including a processor coupled to the switches of the first and second sets.

11. The detection circuit of claim 7 in which the first averaging circuit, the second averaging circuit, and the comparing circuit are analog circuits.

12. A process comprising:
   (a) producing a first average signal in a first circuit by averaging first and second sensor input signals over a first time window with a first capacitor having a first capacitance;
   (b) producing a second average signal in a second circuit by averaging the first and second sensor input signals over a second time window longer than the first time window with a second capacitor having a second capacitance different than the first capacitance;
   (c) comparing the second average signal to a first threshold voltage and comparing the second average signal to a second threshold voltage; and
   (d) producing a fault signal when the second average signal is greater than the first threshold voltage and is less than the second threshold voltage.

13. The process of claim 12 including:
   (a) setting the first threshold voltage with resistors and switches;
   (b) setting the second threshold voltage with resistors and switches.

14. The process of claim 13 including opening and closing switches in response to controls from a processor.

15. The process of claim 12 including performing the steps with only analog circuits.

* * * * *